United States Patent
Kwon et al.

(10) Patent No.: US 9,462,166 B2
(45) Date of Patent: Oct. 4, 2016

(54) IMAGING DEVICE, PORTABLE INFORMATION TERMINAL, AND DISPLAY DEVICE

(71) Applicant: KABUSHIKI KAISHA TOSHIBA, Minato-ku (JP)

(72) Inventors: Honam Kwon, Kawasaki (JP); Kazuhiro Suzuki, Tokyo (JP); Hiroto Honda, Yokohama (JP); Risako Ueno, Tokyo (JP); Mitsuyoshi Kobayashi, Tokyo (JP); Yuko Kizu, Yokohama (JP); Machiko Ito, Yokohama (JP); Hideyuki Funaki, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/197,780

(22) Filed: Mar. 5, 2014

(65) Prior Publication Data

US 2014/0285708 A1  Sep. 25, 2014

(30) Foreign Application Priority Data

Mar. 19, 2013  (JP) .................................. 2013-057122

(51) Int. Cl.
*H04N 5/225* (2006.01)
*H04N 13/02* (2006.01)
(Continued)

(52) U.S. Cl.
CPC ...... *H04N 5/2254* (2013.01); *G02F 1/134309* (2013.01); *G02F 1/29* (2013.01);
(Continued)

(58) Field of Classification Search
CPC ............. H04N 5/2259; H04N 5/2254; H04N 5/23209
USPC ........................................ 348/335, 340, 360
See application file for complete search history.

(56) References Cited

U.S. PATENT DOCUMENTS 4,190,330 A * 2/1980 Berreman ...................... 349/200
6,384,889 B1 * 5/2002 Miyachi ............ G02F 1/133707
349/129

(Continued)

FOREIGN PATENT DOCUMENTS

JP  7-78954  3/1995
JP  2002-214579  7/2002

(Continued)

OTHER PUBLICATIONS

Keith Fife, et al., "A 3D Multi-Aperture Image Sensor Architecture", IEEE 2006 Custom Integrated Circuits Conference (CICC), Sep. 2006, pp. 281-284.

(Continued)

*Primary Examiner* — Sinh Tran
*Assistant Examiner* — Zhenzhen Wu
(74) *Attorney, Agent, or Firm* — Oblon, McClelland, Maier & Neustadt, L.L.P.

(57) ABSTRACT

A solid state imaging device according to an embodiment includes: a liquid crystal optical element including a first electrode having a first recess and a projecting portion surrounding the first recess on a first surface, a second electrode facing the first surface of the first electrode, a filling film located between the first recess of the first electrode and the second electrode, and a liquid crystal layer located between the filling film and the second electrode; an imaging lens facing the second electrode to form an image of a subject on an imaging plane; and an imaging element facing the first recess, the imaging element having a pixel block having a plurality of pixels.

11 Claims, 24 Drawing Sheets

(51) Int. Cl.
*G02F 1/1343* (2006.01)
*G02F 1/29* (2006.01)
*H01L 27/146* (2006.01)

(52) U.S. Cl.
CPC .... *H01L27/14625* (2013.01); *H04N 13/0217* (2013.01); *H04N 13/0289* (2013.01); *G02F 2001/294* (2013.01)

(56) References Cited

U.S. PATENT DOCUMENTS

| | | | |
|---|---|---|---|
| 6,859,333 | B1 | 2/2005 | Ren et al. |
| 8,305,429 | B2 | 11/2012 | Kajihara et al. |
| 9,019,449 | B2 | 4/2015 | Baek et al. |
| 2003/0081153 | A1* | 5/2003 | Kobayashi ........ G02F 1/133526 349/95 |
| 2007/0229754 | A1* | 10/2007 | Galstian et al. ............. 349/200 |
| 2010/0066812 | A1* | 3/2010 | Kajihara et al. ............ 348/46 |
| 2010/0238328 | A1* | 9/2010 | Pillman et al. ............ 348/241 |
| 2012/0320288 | A1* | 12/2012 | Baek et al. ............ 349/5 |
| 2013/0050606 | A1* | 2/2013 | Kang ............ 349/57 |
| 2013/0265485 | A1* | 10/2013 | Kang ............ 348/360 |

FOREIGN PATENT DOCUMENTS

| | | |
|---|---|---|
| JP | 2003-43443 | 2/2003 |
| JP | 2004-1396 | 1/2004 |
| JP | 2006-126721 | 5/2006 |
| JP | 2008-167395 | 7/2008 |
| JP | 2009-48078 | 3/2009 |
| JP | 2009-169025 | 7/2009 |
| JP | 2010-44260 | 2/2010 |
| JP | 2013-3588 | 1/2013 |

OTHER PUBLICATIONS

U.S. Appl. No. 14/206,365, filed Mar. 12, 2014, Kizu, et al.
Japan Office Action issued May 31, 2016 in Japanese Patent Application No. 2013-057122 with English translation, 9 pages.

* cited by examiner

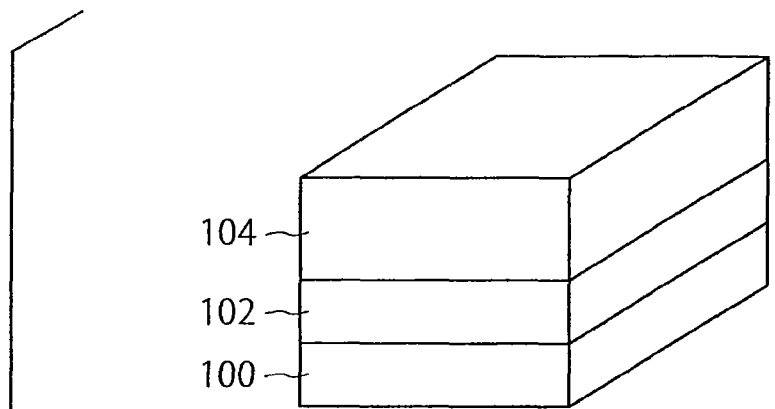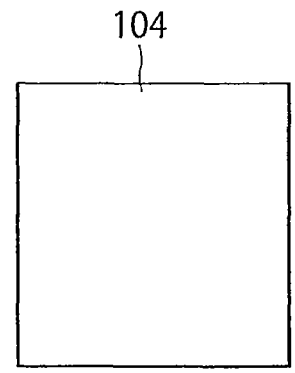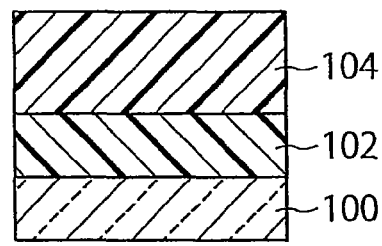
FIG. 10

IMAGING DEVICE, PORTABLE INFORMATION TERMINAL, AND DISPLAY DEVICE

CROSS REFERENCE TO RELATED APPLICATIONS

This application is based upon and claims the benefit of priority from prior Japanese Patent Application No. 2013-057122 filed on Mar. 19, 2013 in Japan, the entire contents of which are incorporated herein by reference.

FIELD

Embodiments described herein relate generally to solid state imaging devices, portable information terminals, and display devices.

BACKGROUND

Various techniques such as a technique using a reference light and a stereo ranging technique using a plurality of cameras are known as imaging techniques for obtaining a depth-direction distance to a subject, serving as two-dimensional array information. In particular, in recent years, imaging devices capable of obtaining distance information at relatively low costs have been increasingly needed to serve as newly developed consumer input devices.

In order to meet the needs, an imaging device with an imaging lens and a compound eye structure is proposed, which obtains multiple parallaxes with the compound eye structure, and is capable of preventing the resolution from being lowered. The imaging device includes, for example, an imaging lens, and a plurality of optical systems serving as re-imaging optical systems arranged between the imaging lens and an imaging element. For example, a microlens array including a plurality of microlenses arranged on a flat substrate is used as the optical systems. Pixels are arranged below the microlenses, each on a position corresponding to a microlens, to obtain images of the microlenses. An image formed by the imaging lens is re-imaged on the imaging element by means of the re-imaging microlenses. The viewpoint of each single-eye image that is re-imaged is shifted from that of an adjacent image by the parallax caused by the position of the corresponding microlens.

A distance to a subject can be estimated based on the principle of triangulation by image-processing the parallax images obtained from the microlenses. Furthermore, the parallax images can be re-configured as a two-dimensional image by combining them by image-processing.

However, the pixels in the aforementioned compound-eye imaging device are reduced by the image-processing. For this reason, a function is needed to switch an imaging mode for obtaining a distance to a subject in a depth direction and an imaging mode for obtaining a high-resolution two-dimensional image.

Liquid crystal optical elements using sealed liquid crystal or gradient index lens (GRIN) are known to have a switching function. The sealed type liquid crystal optical element has an electrode having a concave lens shape, and an alignment film is formed and liquid crystal is filled in the concave portion. In this case, a problem arises in that the alignment film cannot be easily formed uniformly, and the refractive index of the liquid crystal cannot be made uniform easily. On the other hand, with respect to the GRIN type, a hemiprism (lenticular) lens can be formed easily, but a two-dimensional lens array cannot be formed easily.

BRIEF DESCRIPTION OF THE DRAWINGS

FIGS. 10(a) to 10(c) are diagrams for explaining the steps of manufacturing a liquid crystal optical element according to Example 1.

DETAILED DESCRIPTION

A solid state imaging device according to an embodiment includes: a liquid crystal optical element including a first electrode having a first recess and a projecting portion surrounding the first recess on a first surface, a second electrode facing the first surface of the first electrode, a filling film located between the first recess of the first electrode and the second electrode, and a liquid crystal layer located between the filling film and the second electrode; an imaging lens facing the second electrode to form an image of a subject on an imaging plane; and an imaging element facing the first recess, the imaging element having a pixel block having a plurality of pixels.

Embodiments will now be explained with reference to the accompanying drawings.

First Embodiment

Figure 1:
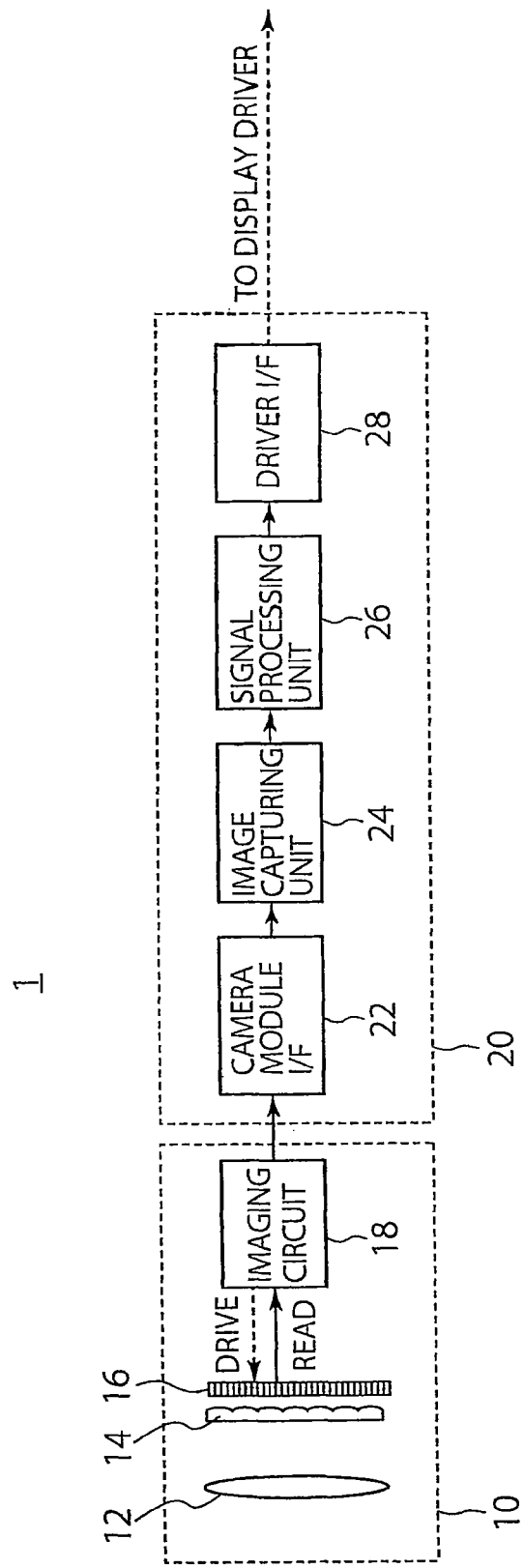
FIG. 1 is a diagram showing a solid state imaging device according to the first embodiment.

FIG. 1 shows a solid state imaging device (hereinafter also referred to as the "camera module") 1 according to the first embodiment. The solid state imaging device 1 according to the first embodiment includes an imaging module unit 10 and an imaging signal processor (hereinafter also referred to as the "ISP") 20.

The imaging module unit 10 includes an imaging optics 12, a liquid crystal optical element 14, an imaging element 16, and an imaging circuit 18. The imaging optics 12 functions as an image capturing optical system to capture light from a subject and transfer it into the imaging element 16. The imaging element 16 faces the imaging optics 12, functions as an element for converting the light captured by the imaging optics 12 to signal charges, and includes a plurality of pixels (for example, photodiodes serving as photoelectric conversion elements) arranged in a two-dimensional array form. A group of pixels form one pixel block. Specifically, the imaging element 16 includes a plurality of pixel blocks, each having a plurality of pixels. The liquid crystal optical element 14 is located between the imaging optics 12 and the imaging element 16, and has a structure in which a liquid crystal layer is located between opposing two electrodes, as will be described later. Applying a voltage to the two electrodes changes the refractive index of the liquid crystal layer, and as a result the liquid crystal optical element 14 becomes to serve as a microlens array including a plurality of microlenses. If no voltage is applied to the two transparent electrodes, the refractive index of the liquid crystal layer does not change, and light rays incident to the liquid crystal optical element 14 pass the liquid crystal optical element 14. Thus, the liquid crystal optical element 14 is capable of switching a lens state and a non-lens state by applying or not applying voltage. In this manner, the solid state imaging device can switch the imaging mode in which a distance to a subject in a depth direction can be obtained, and an imaging mode in which a high-resolution two dimensional image can be obtained.

The liquid crystal optical element 14 serving as a microlens array has projections on a surface facing the imaging element 16. The surface thereof facing the imaging optics 12 is flat. Each of the microlenses of the liquid crystal optical element 14 corresponds to one of the pixel blocks formed on the semiconductor substrate 16a, and functions as a system for reducing and re-forming images of light rays passing through the imaging optics 12 on a pixel block corresponding to the microlens.

Light rays that are focused on an imaging plane by the imaging optics 12 form reduced and reformed images on pixel blocks corresponding to the microlenses of the liquid crystal optical element. The imaging circuit 18 includes a drive circuit unit (not shown) that drives the respective pixels of the imaging element 16, and a pixel signal processing circuit unit (not shown) that processes signals outputted from the pixels. The drive circuit unit and the pixel signal processing circuit unit may be combined to form a drive and processing circuit. In the embodiments described below, the imaging circuit 18 includes a drive and processing circuit. The drive circuit unit includes, for example, a vertical selection circuit that sequentially selects pixel units arranged on horizontal lines (rows) in a vertical direction, a horizontal selection circuit that sequentially selects pixels in units of columns, and a timing generator (TG) circuit that drives the vertical selection circuit and the horizontal selection circuit with several types of pulses. The pixel signal processing circuit unit includes such circuits as an analog-to-digital conversion circuit that converts analog electric signals from the pixel region to digital signals, a gain adjustment and amplifier circuit that performs gain adjustment and amplifying operations, and a digital signal processing circuit that corrects the digital signals.

The ISP 20 includes a camera module interface (I/F) 22, an image capturing unit 24, a signal processing unit 26, and a driver I/F 28. A RAW image obtained by an imaging operation performed by the imaging module unit 10, i.e., the RAW image obtained by the pixel signal processing unit, is captured through the camera module I/F 22 into the image capturing unit 24. The signal processing unit 26 performs a signal processing operation on the RAW image captured into the image capturing unit 24. The driver I/F 28 outputs, to a display driver that is not shown, image signals having been subjected to the signal processing operation at the signal processing unit 26. The display driver displays the image formed by the solid state imaging device.

Figure 2:
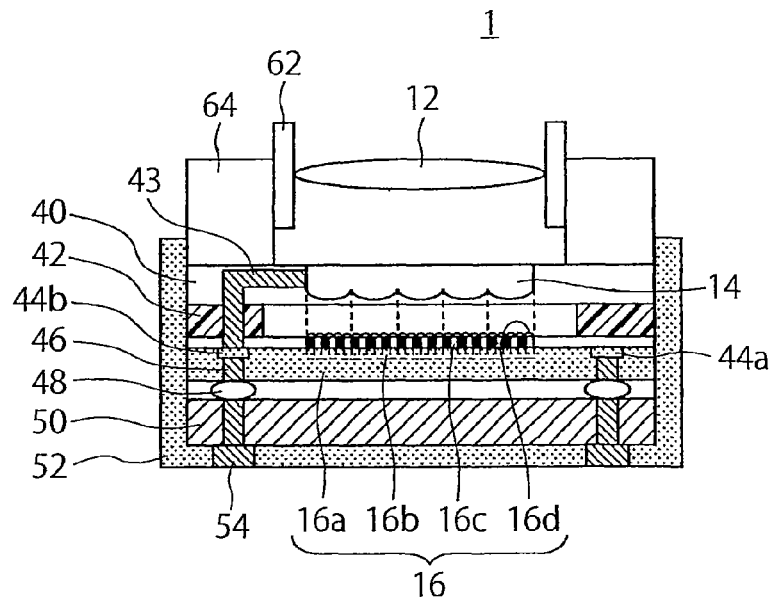
FIG. 2 is a cross-sectional view showing the solid state imaging device according to the first embodiment.

FIG. 2 shows a cross section of the solid state imaging device 1 according to the first embodiment. As shown in FIG. 2, the imaging element 16 of the solid state imaging device 1 according to the first embodiment includes a semiconductor substrate 16a, a plurality of pixels 16b, each having a photodiode, formed on the semiconductor substrate 16a, and a drive/readout circuit (not shown) for driving the pixels 16b to read signals from the pixels 16b. The imaging element 16 may further include color filters 16c located above the pixels 16b. The color filters 16c may include red (R), green (G), and blue (B) filters each corresponding to one of the pixels 16b, which are arranged in, for example, a Bayer array. The imaging element 16 may further include microlenses 16d, each corresponding to and collecting light for the pixels 16b, formed above the color filter 16c. The liquid crystal optical element 14 is arranged above the color filters 16c, and fixed to a liquid crystal optical element holder 40.

The liquid crystal optical element holder 40 is bonded to the semiconductor substrate 16a by, for example, a spacer 42 of a resin that surrounds the imaging region in which the pixels 16b are arranged. In bonding the semiconductor substrate 16a with the liquid crystal optical element holder 40, the alignment is performed using the alignment markings etc.

Furthermore, the semiconductor substrate 16a has an electrode pad 44a for reading the pixels 16b, an electrode pad 44b for driving the liquid crystal optical element 14, and through-electrodes 46 arranged below the electrode pads 44a, 44b and penetrating the semiconductor substrate 16c.

The semiconductor substrate 16a is electrically connected to a chip 50 via bumps 48 located between the through-electrodes 46 and the chip 50. A drive processing circuit (imaging circuit 18) for driving the imaging device to process the read signals and for driving the liquid crystal optical element 14 is formed on the chip 50.

An imaging lens 12 is located above the liquid crystal optical element 14. The imaging lens 12 is fixed to a lens barrel 62 that is further fixed to a lens holder 64. The lens holder 64 is bonded onto the liquid crystal optical element holder 40. The position of the lens 12 may be adjusted when it is fixed to the lens barrel 62 by adjusting the force to press the lens holder 64 to the liquid crystal optical element holder 40 while the image output from the solid state imaging device 1 is monitored. A light-shielding cover 52 may be fixed around the semiconductor substrate 16a, the liquid crystal optical element holder 40, and the chip 50 to shield unnecessary light. Furthermore, a module electrode 54 for electrically connecting the chip 50 to the outside may be provided to the light-shielding cover 52. The structure of the solid state imaging device 1 is not limited to the aforementioned one. For example, the electrode pads 44a, 44b may be electrically connected to an external chip by wire bonding.

Next, the liquid crystal optical element 14 will be described below.

Figure 3:
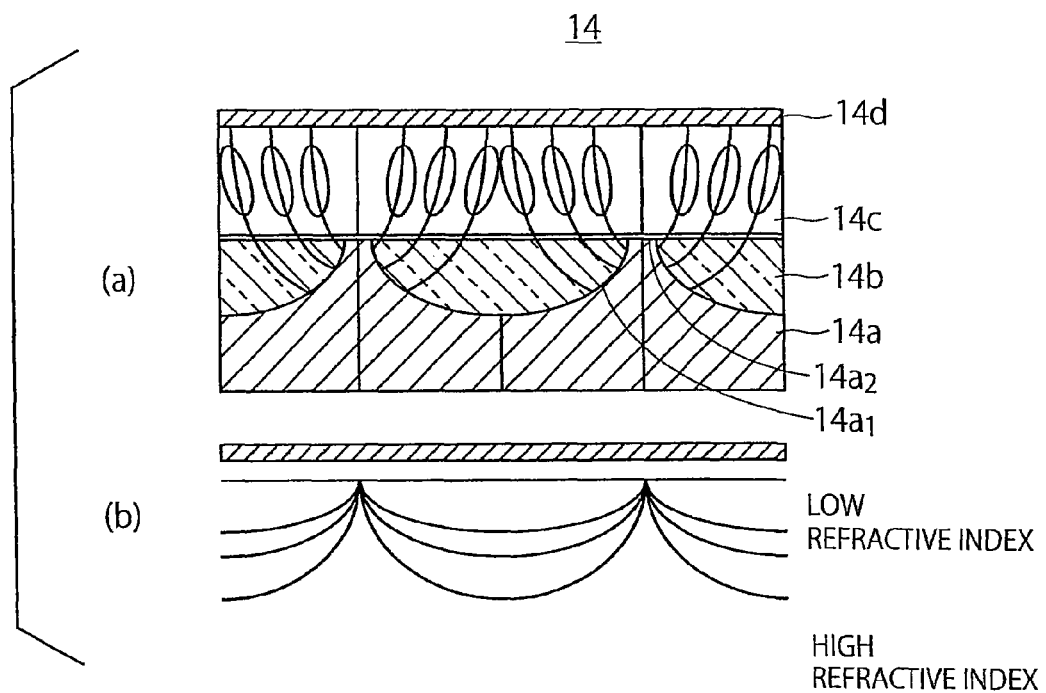
FIGS. 3(a) and 3(b) are diagrams for explaining a specific example of a liquid crystal optical element according to the first embodiment.

A liquid crystal layer formed on a main surface of a substrate generally has a characteristic in that as the degree of tilt of the long axes of liquid crystal molecules constituting the liquid crystal layer relative to the normal line of the main surface of the substrate increases, the refractive index thereof increases. Incidentally, liquid crystal molecules have long axes and short axes, and the optical element 14 uses this characteristic of liquid crystals. The principle of the liquid crystal optical element 14 will be described with reference to FIGS. 3(a) and 3(b). FIG. 3(a) is a cross-sectional view showing a specific example of the liquid crystal optical element 14, and FIG. 3(b) shows a refractive index distribution of the liquid crystal optical element 14.

Figure 4:
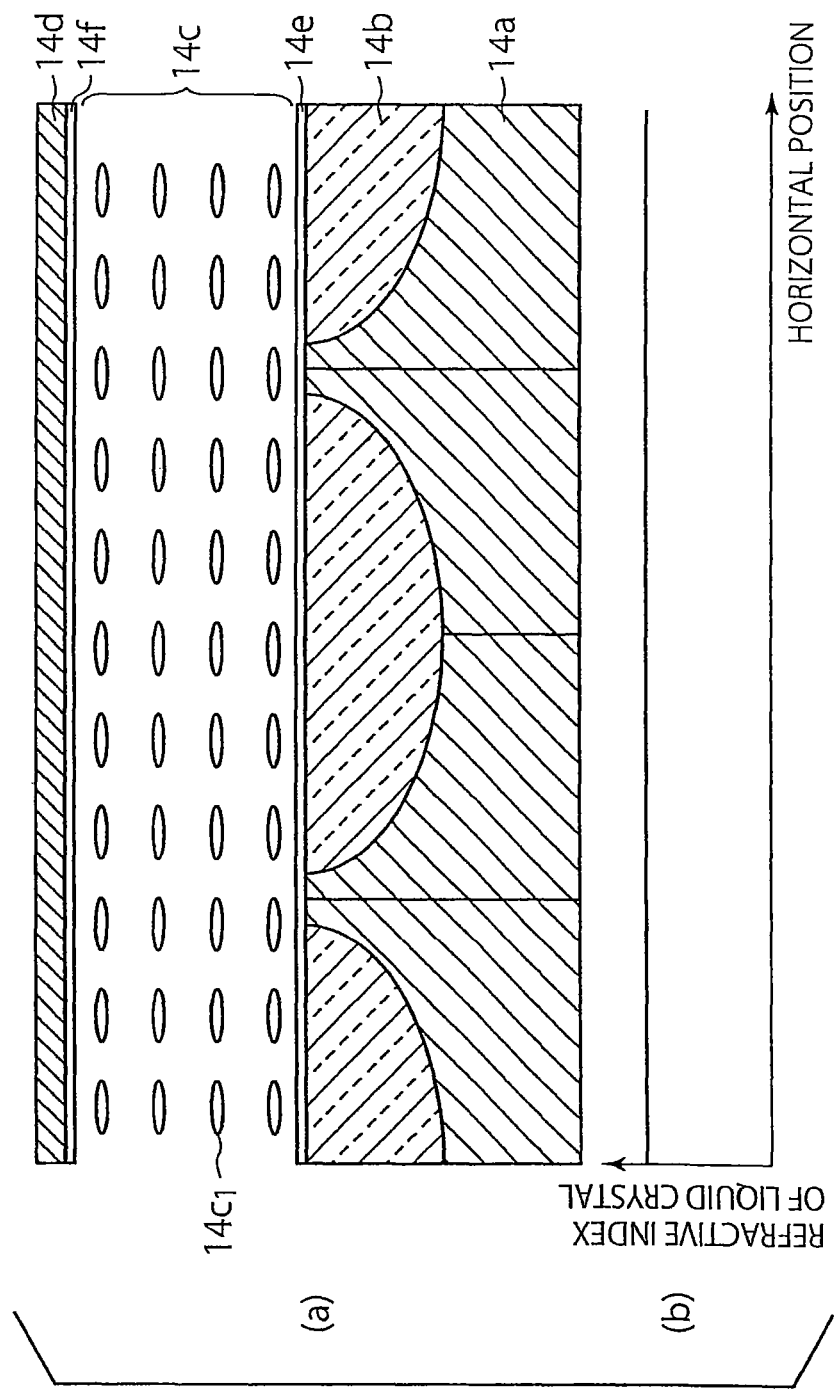
FIGS. 4(a) and 4(b) are diagrams showing a state in a case where liquid crystal molecules of a liquid crystal layer in the liquid crystal optical element are horizontally aligned when no voltage is applied, and a refractive index distribution in such a case.

The liquid crystal optical element 14 of the specific example includes a first electrode 14a, a filling film 14b, a liquid crystal layer 14c, and a second electrode 14d. The first electrode 14a has, on a main surface, a plurality of recesses $14a_1$ that are regularly arranged, and a plurality of projecting portions $14a_2$ arranged therebetween. The recesses $14a_1$ are arranged, for example, squarely or hexagonally. The shape of the cross section of a recess $14a_1$ is, for example, a hemisphere. The filling film 14b is filled into the recesses $14a_1$, and the surface thereof is smoothed thereafter. As a result, the surface of the filling film 14b facing the liquid crystal layer 14c is planar. The second electrode 14d is arranged to face the planar surface of the filling film 14b. The liquid crystal layer 14c is located between the filling film 14b and the second electrode 14d. As shown in FIGS. 4(a) and 4(b), alignment films 14e, 14f for aligning the liquid crystal molecules in the liquid crystal layer 14c are arranged on a surface of the filling film 14b on the side of the liquid crystal layer 14c and a surface of the second electrode 14d on the side of the first electrode 14a. The first electrode 14a, the filling film 14b, the second electrode 14d, and the alignment films 14e, 14f are transparent to light, and transmit at least part of visible light, for example.

When no voltage is applied between the first electrode 14a and the second electrode 14d, the alignment films 14e, 14f align the liquid crystal molecules 14c1 so as to be substantially perpendicular to the normal line of the second electrode 14d (FIG. 4(a)). FIG. 4(b) shows a refractive index distribution of the liquid crystal layer 14c on such an occasion.

Figure 5:
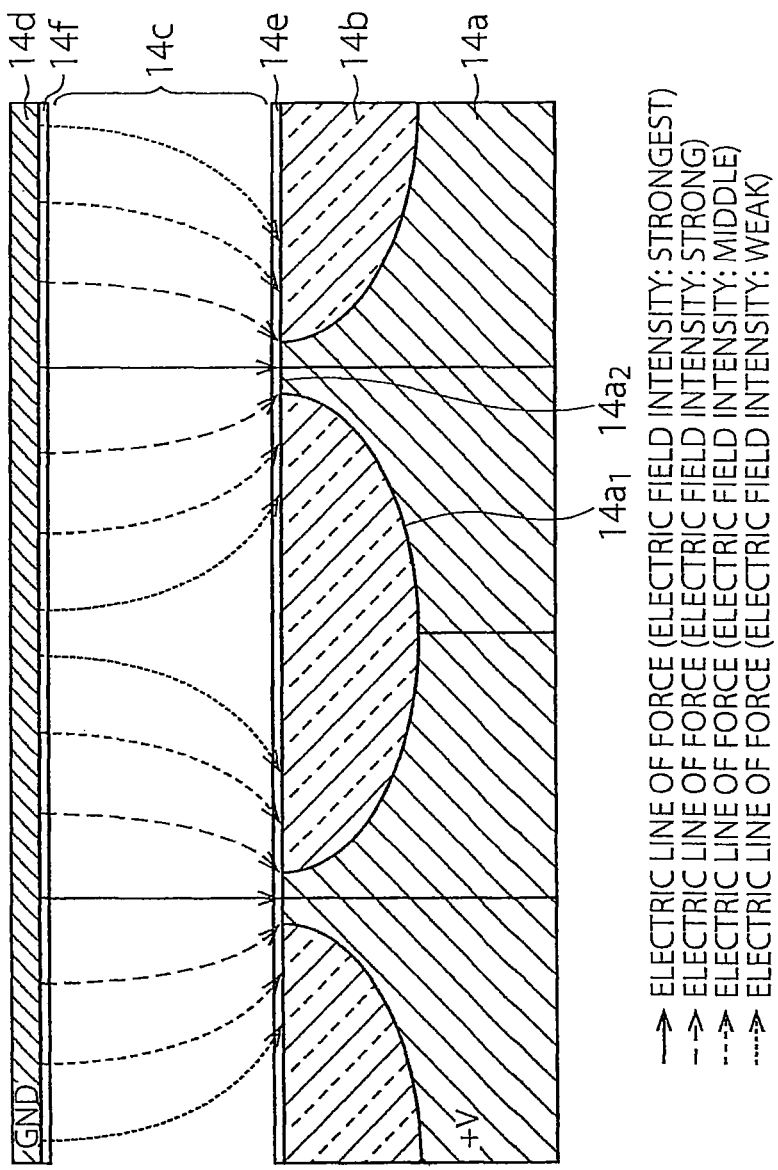
FIG. 5 is a diagram showing a distribution of electric flux lines within liquid crystal when a voltage is applied thereto.
Figure 6:
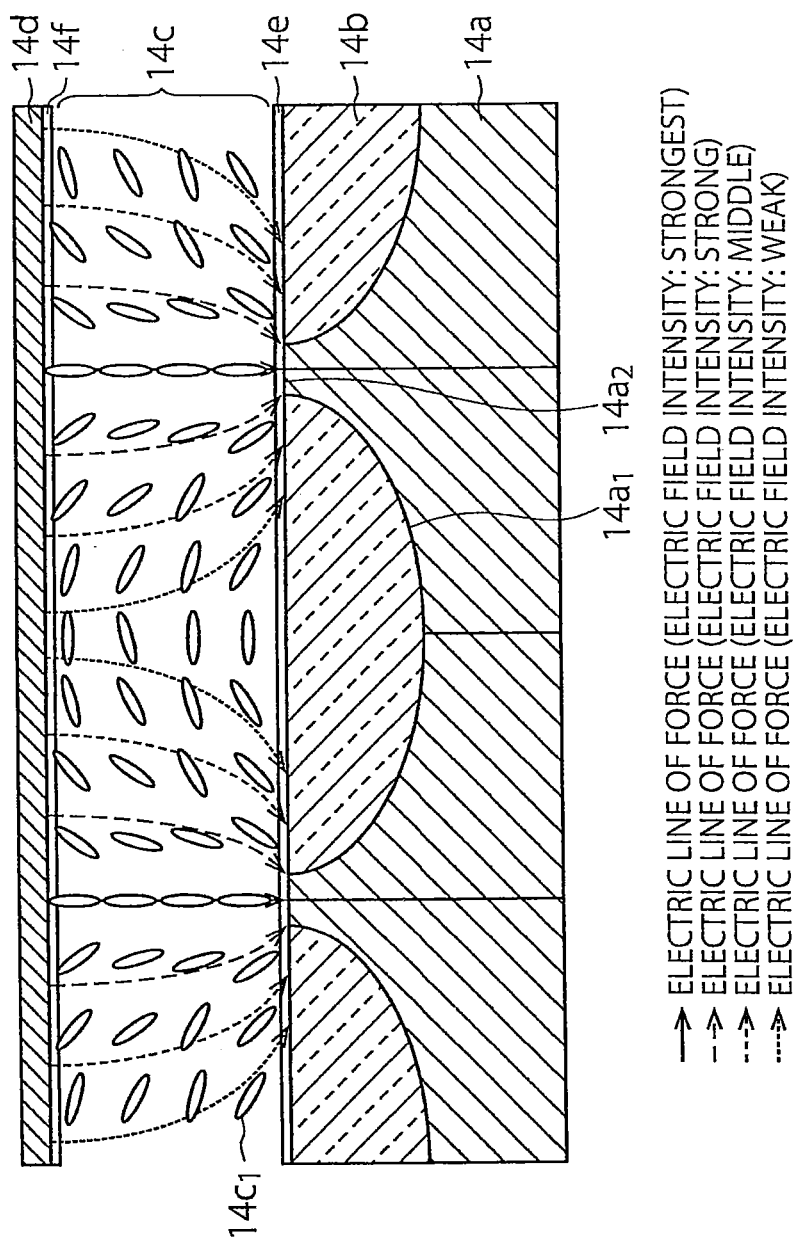
FIG. 6 is a diagram showing a state of liquid crystal molecules in a liquid crystal optical element when a voltage is applied to the liquid crystal molecules in a parallel alignment state.

In the liquid crystal optical element 14 thus structured, the distance from the first electrode 14a to the second electrode 14d is the shortest at the projecting portions $14a_2$. The distance between the first electrode 14a to the second electrode 14d increases from an end to the center of a recess $14a_1$. Thus the distance reaches a maximum at the center of the recess $14a_1$. If, in this state, a voltage is applied between the first electrode 14a and the second electrode 14d by, for example, connecting the second electrode 14d to GND and applying a positive voltage to the first electrode 14a as shown in FIG. 5, the electric field between the projecting portions $14a_2$ and the second electrode 14d of the first electrode 14a increases. The intensity of the electric field decreases from an end to the center of a recess $14a_1$ of the first electrode 14a. Thus, the intensity of the electric field is at a minimum at the center. Specifically, as shown in FIG. 6, the liquid crystal molecules 14c1 between a projecting portion $14a_2$ and the second electrode 14d of the first electrode 14a are aligned to be substantially perpendicular to the second electrode 14d, and the liquid crystal molecules 14c1 between the central portion of a recess $14a_1$ and the second electrode 14d of the first electrode 14a are aligned to be substantially parallel to the second electrode 14d. As a result, as shown in FIG. 3(b), the average refractive index in the liquid crystal layer 14c between the projecting portions $14a_2$ of the first electrode 14a and the second electrode 14d becomes low, and the average refractive index in the liquid crystal layer 14c between the central portions of the recesses $14a_1$ of the first electrode 14a and the second electrode 14d becomes high.

Thus, applying a voltage between the first electrode 14a and the second electrode 14d of the liquid crystal optical element 14 changes the refractive index distribution in the liquid crystal layer 14c. If the recess $14a_1$ of the first electrode 14a is shaped to have a lens shape, and a voltage is applied to the liquid crystal optical element 14, a lens having a refractive index distribution can be obtained. If no voltage is applied between the first electrode 14a and the second electrode 14d of the liquid crystal optical element 14, the liquid crystal molecules 14c1 are aligned to be substantially parallel to the second electrode 14d, and no refractive index distribution is formed. Therefore, the liquid crystal optical element 14 does not have a lens function, and light incident to the liquid crystal optical element 14 linearly moves and transmits the liquid crystal optical element 14.

Figure 7:
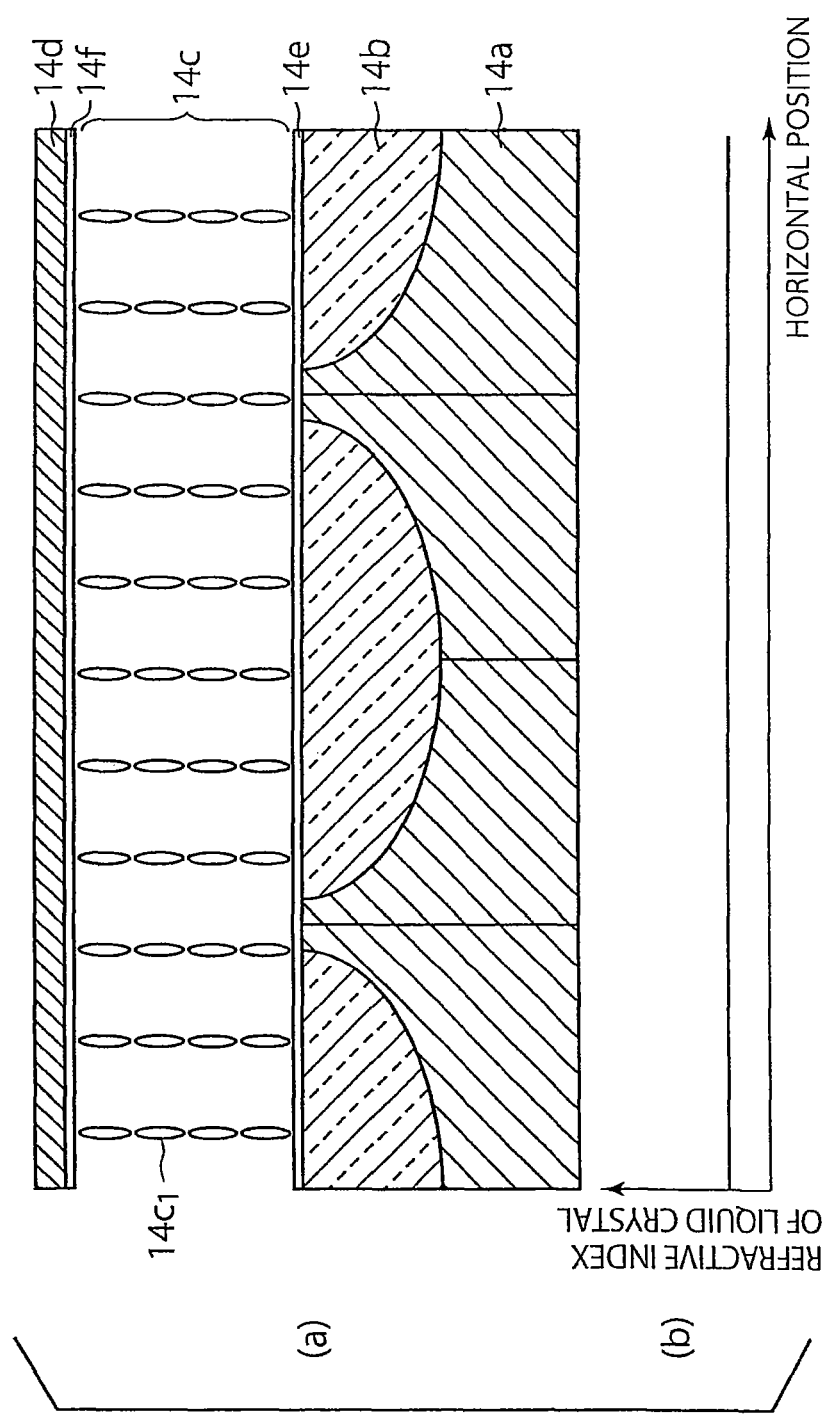
FIGS. 7(a) and 7(b) are diagrams showing a state where the liquid crystal molecules in the liquid crystal layer of the liquid crystal optical element are vertically aligned when no voltage is applied, and a refractive index distribution in such a case.
Figure 8:
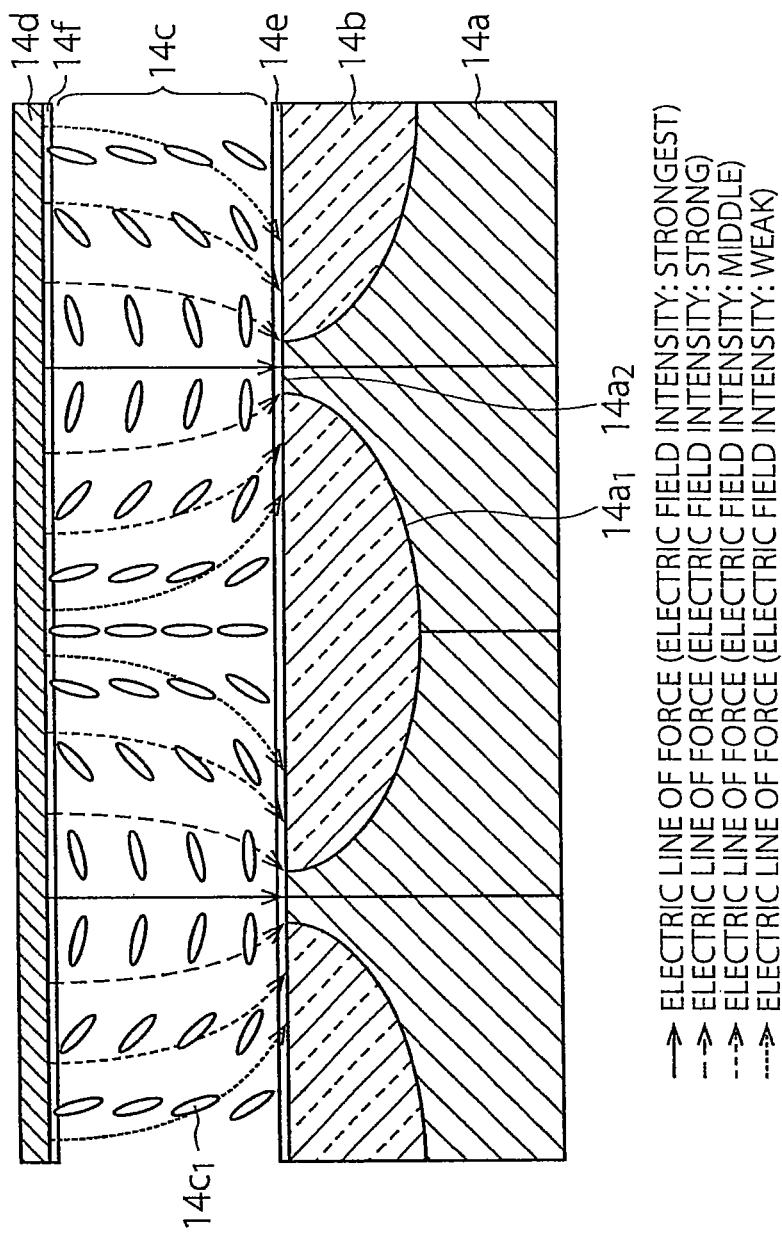
FIG. 8 is a diagram showing a state of the liquid crystal molecules in the liquid crystal optical element when a voltage is applied to the liquid crystal molecules in a vertical alignment state.
Figure 9:
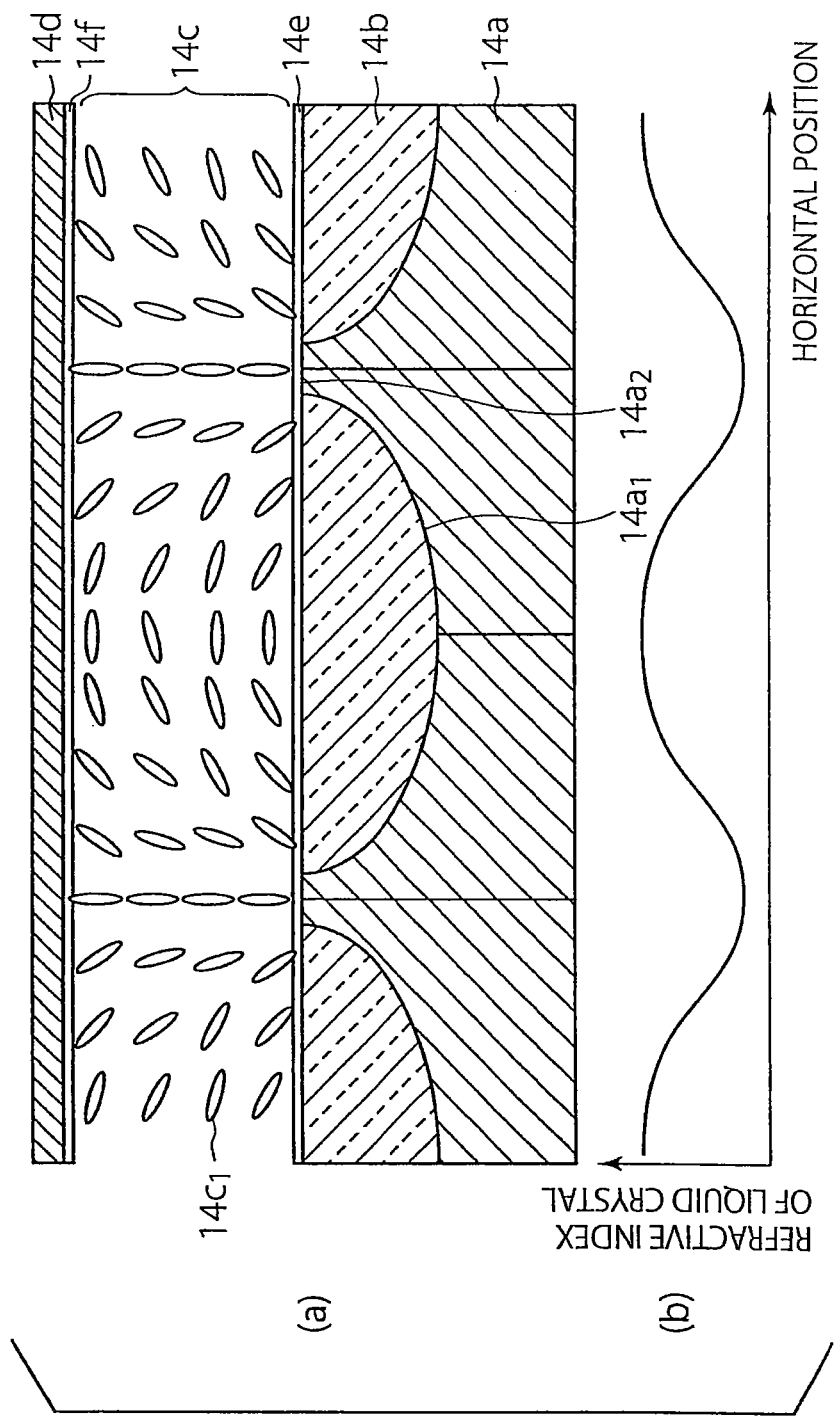
FIGS. 9(a) and 9(b) are diagrams showing a state of the liquid crystal molecules in the liquid crystal optical element when a voltage is applied to the liquid crystal molecules in a vertical alignment state, and a refractive index distribution in such a case.
Figure 11:
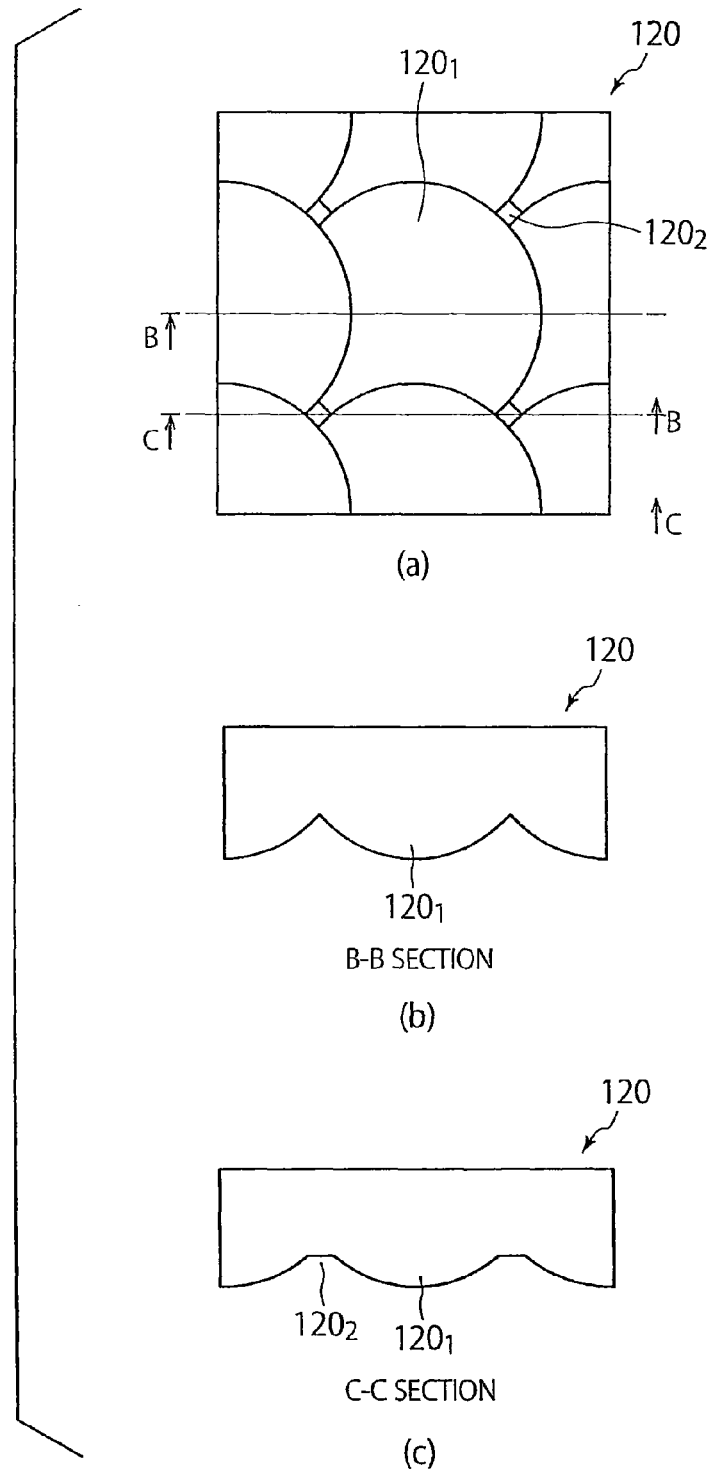
FIGS. 11(a) to 11(c) are diagrams for explaining an example of a master used in manufacturing the liquid crystal optical element according to Example 1.
Figure 12:
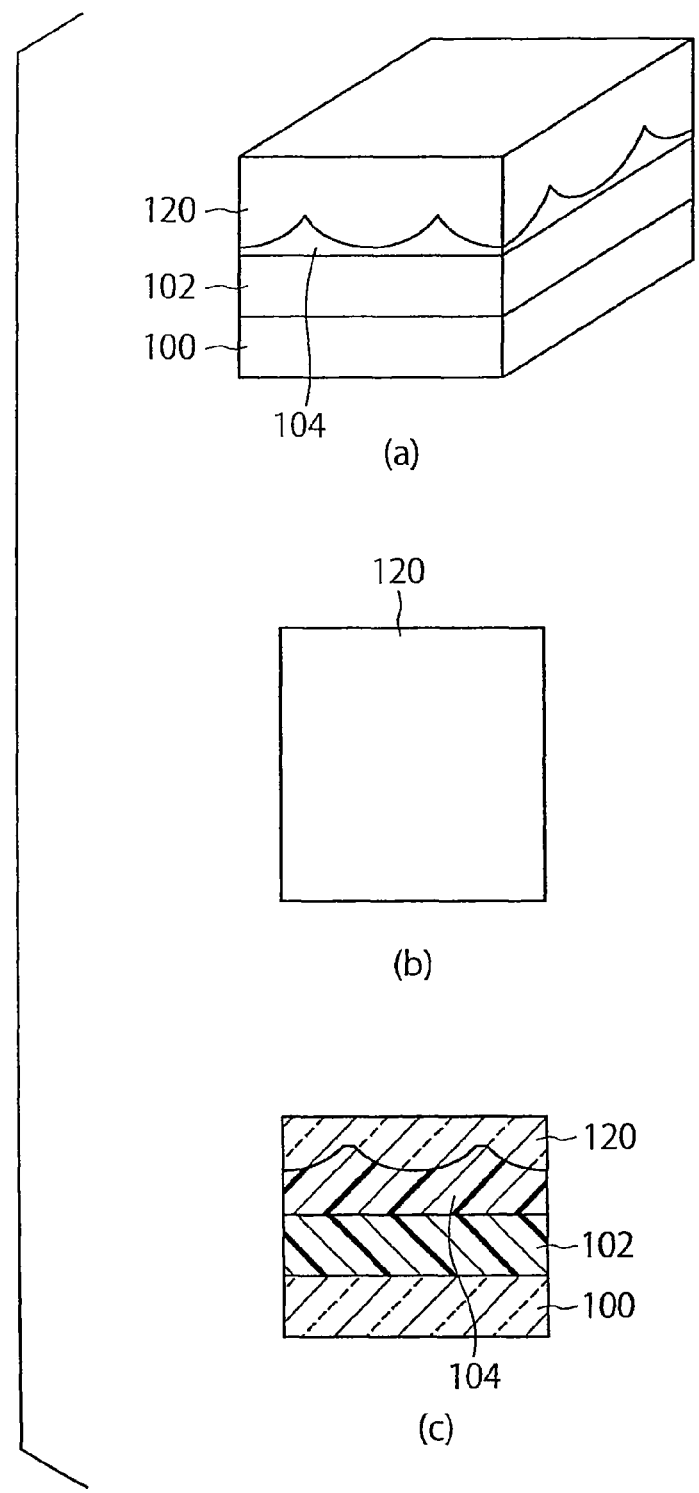
FIGS. 12(a) to 12(c) are diagrams for explaining the steps of manufacturing the liquid crystal optical element according to the Example 1.
Figure 13:
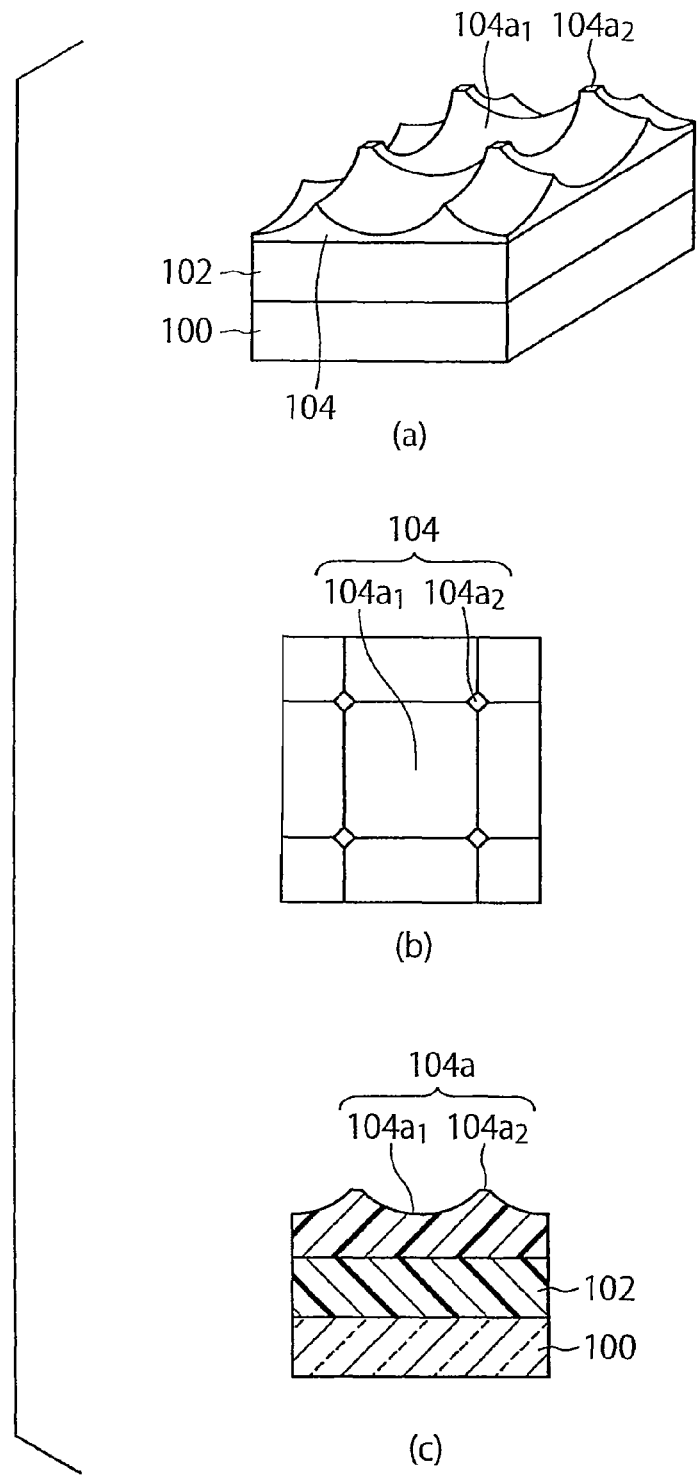
FIGS. 13(a) to 13(c) are diagrams for explaining the steps of manufacturing the liquid crystal optical element according to Example 1.
Figure 14:
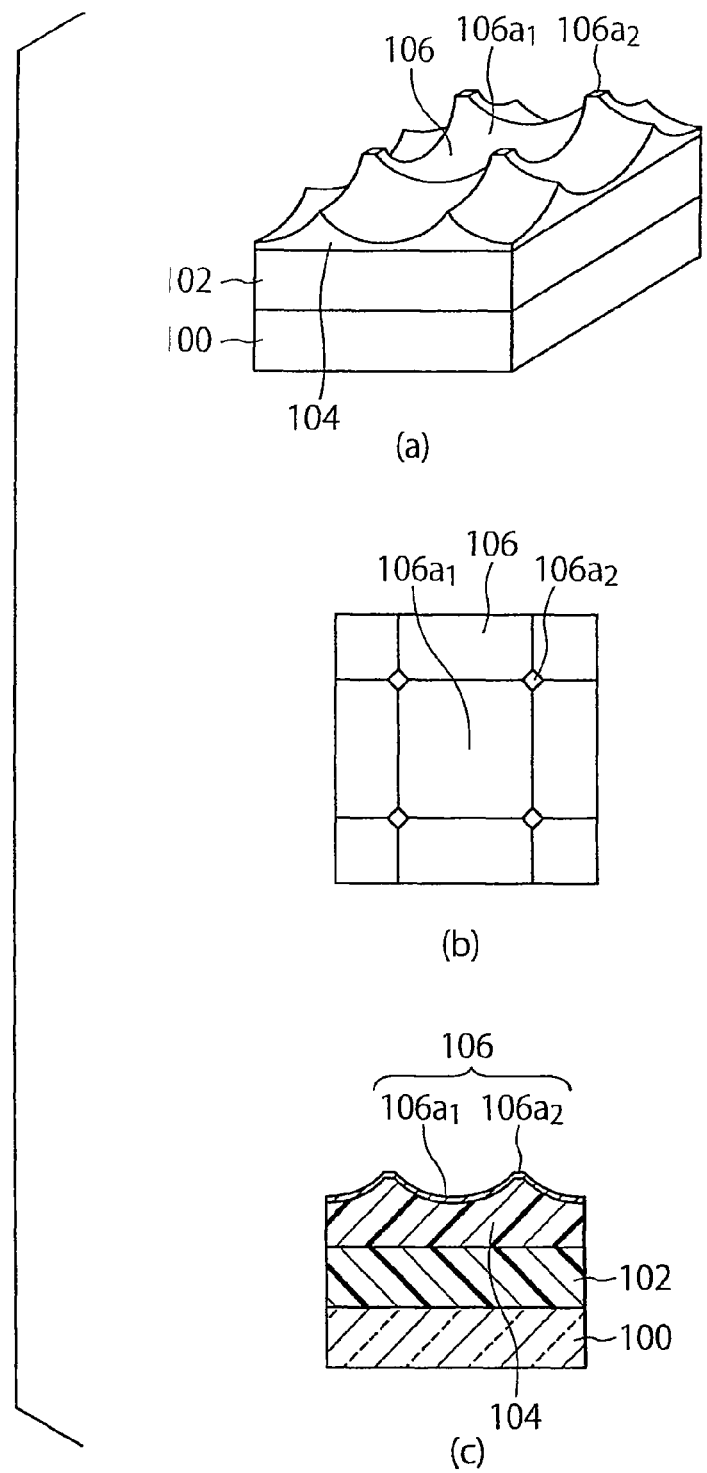
FIGS. 14(a) to 14(c) are diagrams for explaining the steps of manufacturing the liquid crystal optical element according to Example 1.
Figure 15:
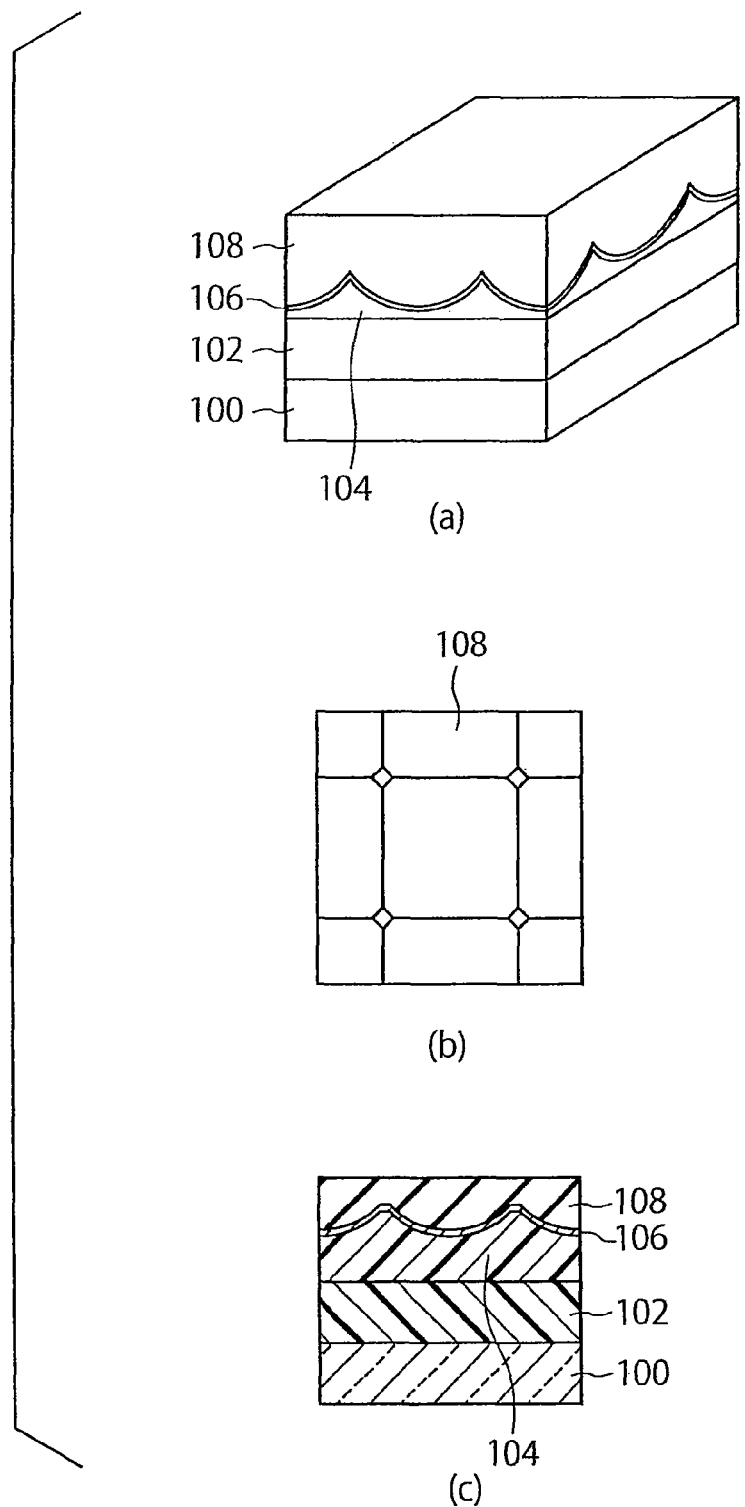
FIGS. 15(a) to 15(c) are diagrams for explaining the steps of manufacturing the liquid crystal optical element according to Example 1.
Figure 16:
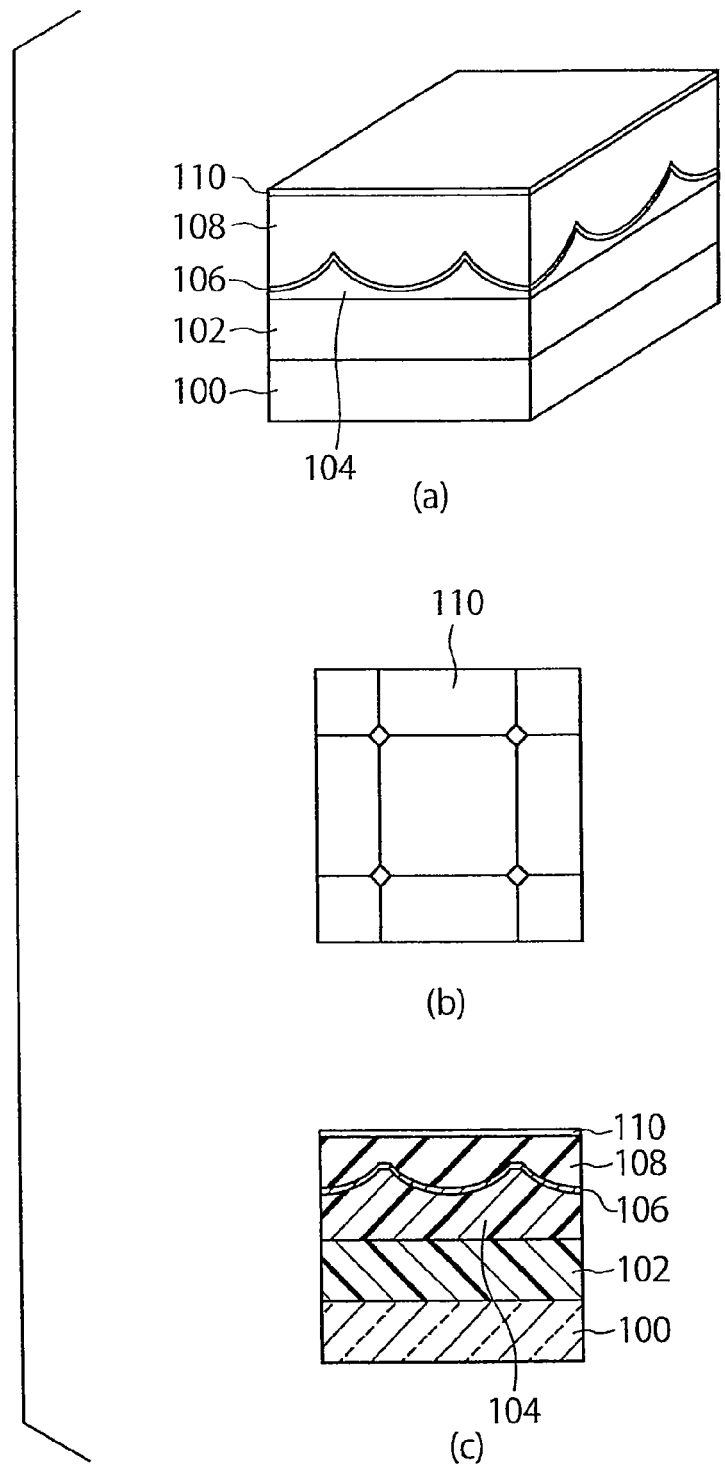
FIGS. 16(a) to 16(c) are diagrams for explaining the steps of manufacturing the liquid crystal optical element according to Example 1.
Figure 17:
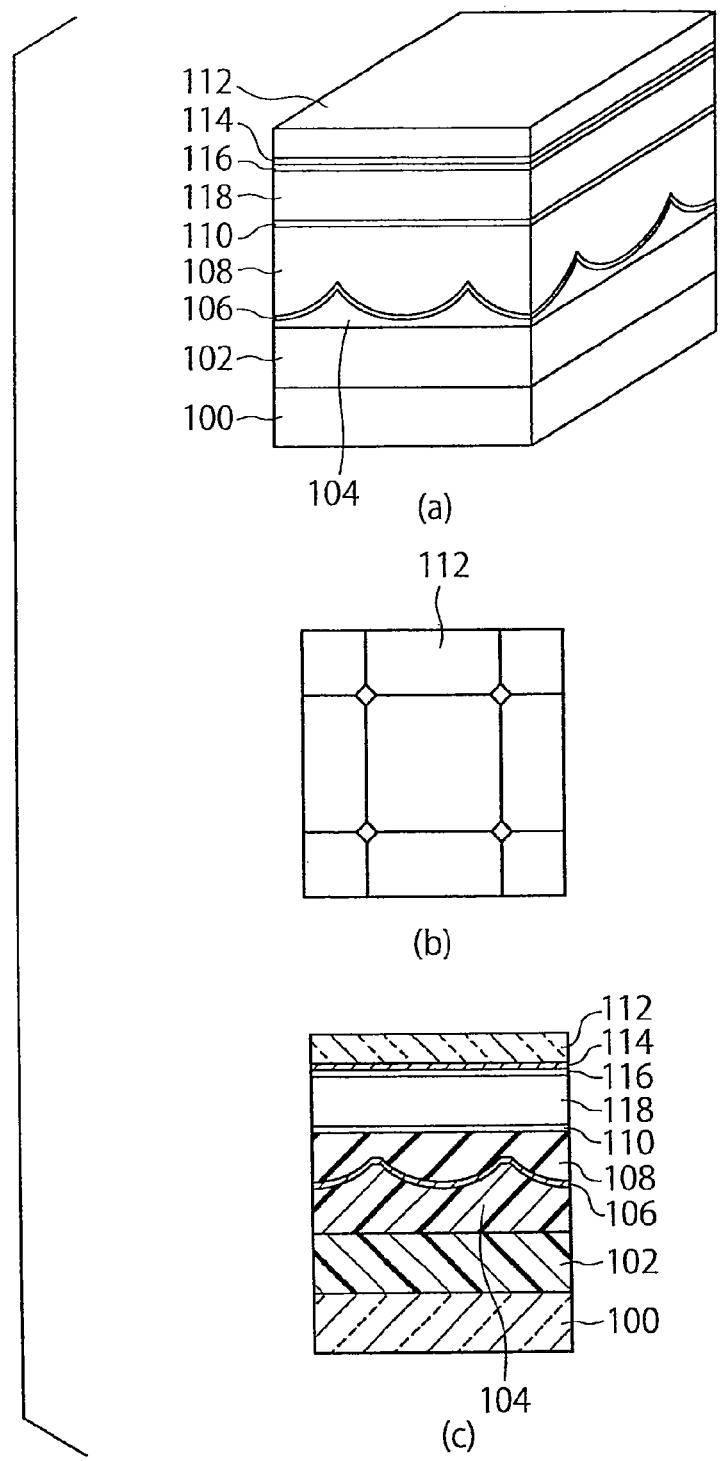
FIGS. 17(a) to 17(c) are diagrams for explaining the steps of manufacturing the liquid crystal optical element according to Example 1.
Figure 18:
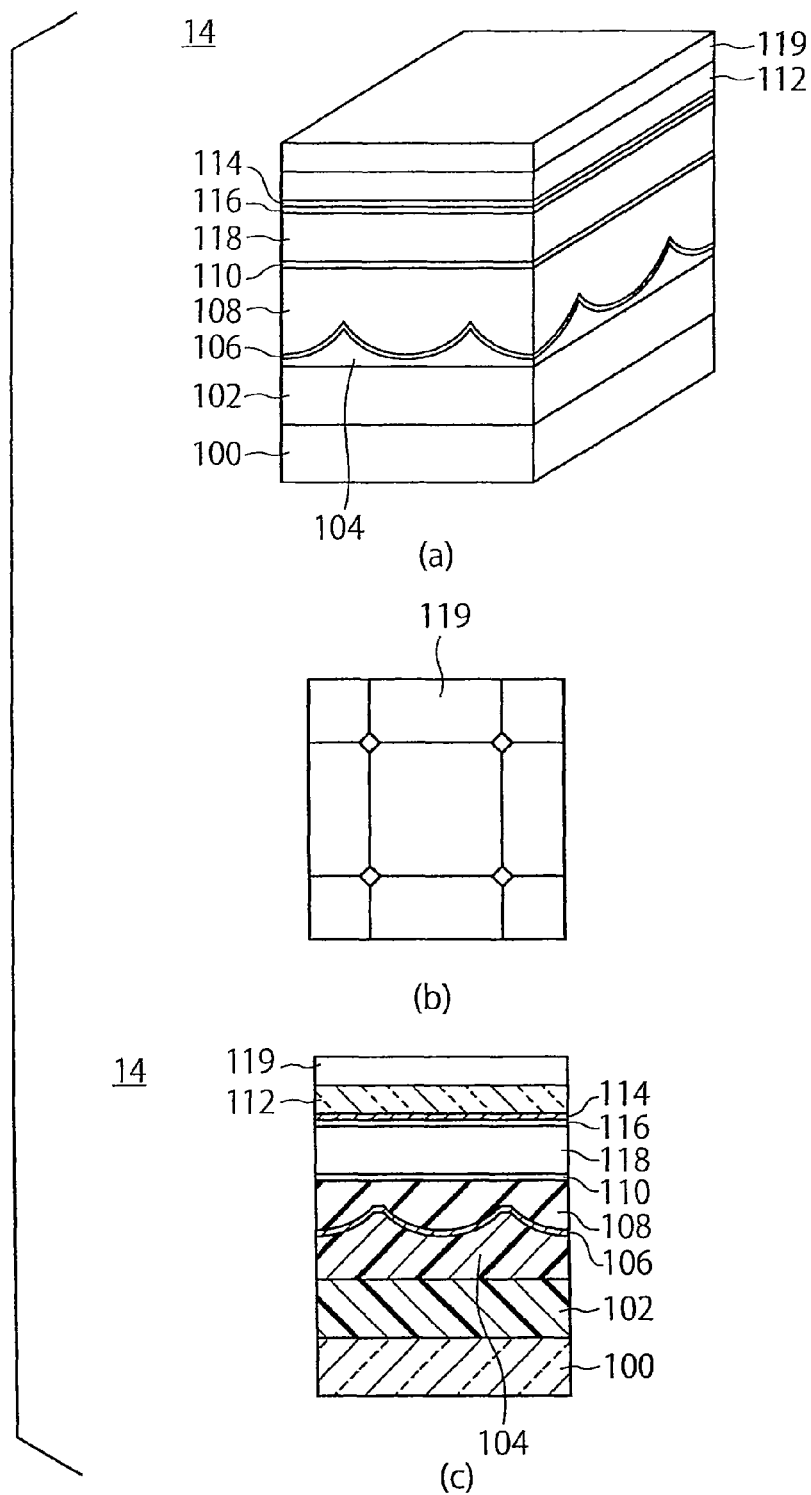
FIGS. 18(a) to 18(c) are diagrams for explaining the steps of manufacturing the liquid crystal optical element according to Example 1.

In the foregoing explanation, the alignment films 14e, 14f align the liquid crystal molecules 14c1 so that the long axes thereof are substantially perpendicular to the normal line of the second electrode 14d when no voltage is applied between the first electrode 14a and the second electrode 14d. However, as shown in FIG. 7(a), the alignment films 14e, 14f may align the liquid crystal molecules 14c1 to be substantially parallel to the normal line of the second electrode 14d when no voltage is applied between the first electrode 14a and the second electrode 14d. FIG. 7(b) shows a refractive index distribution of the liquid crystal layer 14c in such a case. In this case, the refractive index of the liquid crystal layer 14c is in a low state. If a voltage is applied between the first electrode 14a and the second electrode 14d, the electric field between the projecting portions $14a_2$ of the first electrode 14a and the second electrode 14d becomes strong, and the intensity of the electric field decreases from an end to the central portion of a recess $14a_1$ of the first electrode 14a, as shown in FIG. 8. Thus, the liquid crystal molecules 14c1 between the projecting portions $14a_2$ of the first electrode 14a and the second electrode 14d are aligned to be substantially perpendicular to the second electrode 14d, and the liquid crystal molecules 14c1 between the central portions of the recesses $14a_1$ of the first electrode 14a and the second electrode 14d are aligned to be substantially parallel to the second electrode 14d, as shown in FIGS. 8 and 9(a). Accordingly, the average refractive index becomes low between the projecting portions $14a_2$ of the first electrode 14a and the second electrode 14d in the liquid crystal layer 14c, and becomes high between the central portions of the recesses $14a_1$ of the first electrode 14a and the second electrode 14d, as shown in FIG. 9(b).

In the specific example shown in FIGS. 3(a) and 3(b), the first electrode 14a and the second electrode 14d are transparent electrodes. However, as will be described later, the first electrode 14a may be a transparent electrode film formed on a transparent first substrate having squarely or hexagonally arranged recesses on its surface. Similarly, the second electrode 14d may be a transparent electrode film formed on a transparent second substrate having a planar surface.

If no voltage is applied, incident light linearly passes the liquid crystal optical element of this embodiment, and if a voltage is applied, the liquid crystal of the liquid crystal optical element becomes to have a refractive index distribution, and to have a lens function. As the surface of the first electrode 14a is flattened by the filling film 14b in this embodiment, uniform alignment films can be formed, which helps to form fine microlenses with accuracy.

A first polarizing plate may be formed to face the liquid crystal layer 14c via the first electrode 14a. Furthermore, a second polarizing plate may be formed to face the liquid crystal layer 14c via the second electrode 14d.

Hereinbelow, examples of the liquid crystal optical element 14 will be described.

Example 1

A liquid crystal optical element 14 according to Example 1 will be described with reference to FIGS. 10(a) to 18(c) showing the steps of manufacturing the liquid crystal optical element 14 according to Example 1. An imaging position adjusting film 102 having a thickness of 30 μm to 100 μm are formed on a wafer 100, on which the imaging element 16 shown in FIG. 2, for example, is formed. Subsequently, a base film 104 is formed on the imaging position adjusting film 102, the base film 104 serving as a base of the first electrode 14a of the optical element 14. FIGS. 10(a), 10(b), and 10(c) are a perspective view, a top view, and a cross-sectional view in the state where the base film 104 is formed.

The thickness of the imaging position adjusting film 102 is adjusted so that the focal position of the liquid crystal optical element 14 when it acts as a lens is on top surfaces of the pixels 16b of the imaging element 16. The imaging position adjusting film 102 is rather thick, and thus is preferably formed of a resin. However, silicon oxide may also be used.

The base film 104 is also rather thick, and is preferably formed of a resin, but silicon oxide can be used. The base film 104 may be or may not be formed of the same material as the imaging position adjusting film 102.

Subsequently, a master (mold) 120 in a lens-array shape shown in FIGS. 11(a) to 11(c) is prepared. FIG. 11(a) is a bottom view of the master 120, FIG. 11(b) is a cross-sectional view taken along line B-B of FIG. 11(a), and FIG. 11(c) is a cross-sectional view taken along line C-C of FIG. 11(a). The master 120 is formed of, for example, quartz, and has a pattern of squarely arranged projecting portions $120_1$ and recesses $120_2$, for example. The projecting portions $120_1$ correspond to the projecting portions of each lens.

Thereafter, the master 120 is pressed to the base film 104 shown in FIGS. 10(a) to 10(c) by an imprinting method to transfer the pattern on the master 120 to the base film 104. FIGS. 12(a), 12(b), and 12(c) show a perspective view, a top view, and a cross-sectional view of the state in which the master 120 is pressed to the base film 104.

If the base film 104 is formed of a resin, the resin is cured by a heat treatment or ultraviolet irradiation. Then, the master 120 is removed from the base film 104. FIGS. 13(a), 13(b), and 13(c) are a perspective view, a top view, and a cross-sectional view of the state in which the master 120 is removed. A lens pattern is transferred to a surface of the base film 104. The base film 104 now has recesses $104a_1$ that are squarely arranged, and projecting portions $104a_2$ each having a planar top and located at a corner portion of the recesses $104a_1$. Specifically, a pattern having projections that is a square in the top view and has the recesses $104a_1$ each having a hemisphere cross-section is transferred to the base film 104. The base film 104, on which the pattern is transferred, corresponds to the first substrate described above. In the pattern formed on the base film 104, some portions of the recesses $104a_1$ overlap, and the boundaries of the overlapped portions of the recesses $104a_1$ are recessed relative to the planar top surfaces of the projecting portions $104a_2$.

Subsequently, a transparent electrode film 106 to serve as the first electrode is formed on the base film 104, as shown in FIGS. 14(a) to 14(c). FIGS. 14(a) to 14(c) are a perspective view, a top view, and a cross-sectional view in the state in which the transparent electrode film 106 is formed. The transparent electrode film 106 is formed of, for example, indium tin oxide (ITO). The transparent electrode film 106 may be formed of a graphene sheet. Since the pattern on the base film 104 is simple, a sputtering method can be used to form the transparent electrode film 106. The transparent electrode film 106 and the base film 104 correspond to the first electrode 14a shown in FIG. 3. Portions of the transparent electrode film 106 on the recesses $104a_1$ of the base film 104 correspond to the recesses $14a_1$ of the first electrode 14a, and portions of the transparent electrode film 106 on the projecting portions $104a_2$ of the base film 104 correspond to the projecting portions $14a_2$ of the first electrode 14a. Thus, the transparent electrode film 106 has the recesses $106a_1$ that are regularly arranged, and the projecting portions $106a_2$ at the corner portions of the recesses $106a_1$.

Next, an embedded film 108 (filling film 14b) is filled in the recesses $106a_1$ of the transparent electrode 106, and the surface thereof is flattened as shown in FIGS. 15(a) to 15(c), which are a perspective view, a top view, and a cross-sectional view of the flattened state. The embedded film 108 is formed of, for example, a transparent resin or silicon oxide. If the embedded film 108 is formed of a resin, the resin is cured by a heat treatment or ultraviolet irradiation.

Thereafter, as shown in FIGS. 16(a) to 16(c), an alignment film 110 is formed on the embedded film 108. FIGS. 16(a) to 16(c) are a perspective view, a top view, and a cross-sectional view of the state in which the alignment film 110 is formed. The alignment film 110 is formed of, for example, polyimide.

Subsequently, a transparent substrate 112 of quartz, for example, is prepared, and a transparent electrode film 114 of ITO, for example, is formed on the transparent substrate 112. Thereafter, an alignment film 116 of polyimide, for example, is formed on the transparent electrode film 114. A sealing agent (adhesive) is applied to outer regions of the surface of the transparent substrate 112, on which the transparent electrode film 114 is formed. Thereafter, the transparent substrate 100 and the transparent substrate 112 are bonded so that the alignment film 116 faces the alignment film 110. The sealing agent applied to the outer regions of the transparent substrate 112 has an opening for inserting a material of the liquid crystal layer 118 therethrough. After the transparent substrate 100 and the transparent substrate 112 are bonded, the material of the liquid crystal layer 118 is inserted through the opening. Then, the opening is sealed by the sealing agent. As a result, a liquid crystal optical element in which the liquid crystal layer 118 is located between the alignment film 110 and the alignment film 116 is formed, as shown in FIGS. 17(a) to 17(c), which are a perspective view, a top view, and a cross-sectional view of the state after the liquid crystal layer 118 is inserted.

Next, as shown in FIGS. 18(a) to 18(c), a polarizing plate 119 is formed on the transparent substrate 112 to complete the liquid crystal optical element 14. FIGS. 18(a) to 18(c) are a perspective view, a top view, and a cross-sectional view of the state in which the liquid crystal optical element 14 is formed.

Although the surface of the transparent electrode film 114 on the side of the liquid crystal layer 118 is planar in this embodiment, the main surface of the transparent electrode film 114 on the side of the liquid crystal layer 118 may have recesses. The respective recesses may be formed to correspond to the recesses $104a_1$ of the base film 104. In such a case, the transparent substrate 112 may have recesses, and the recesses of the transparent electrode film 114 may be formed along these recesses. The recesses of the transparent substrate 112 and the transparent electrode film 114 may be in a hemispheric shape.

Example 2

Figure 19:
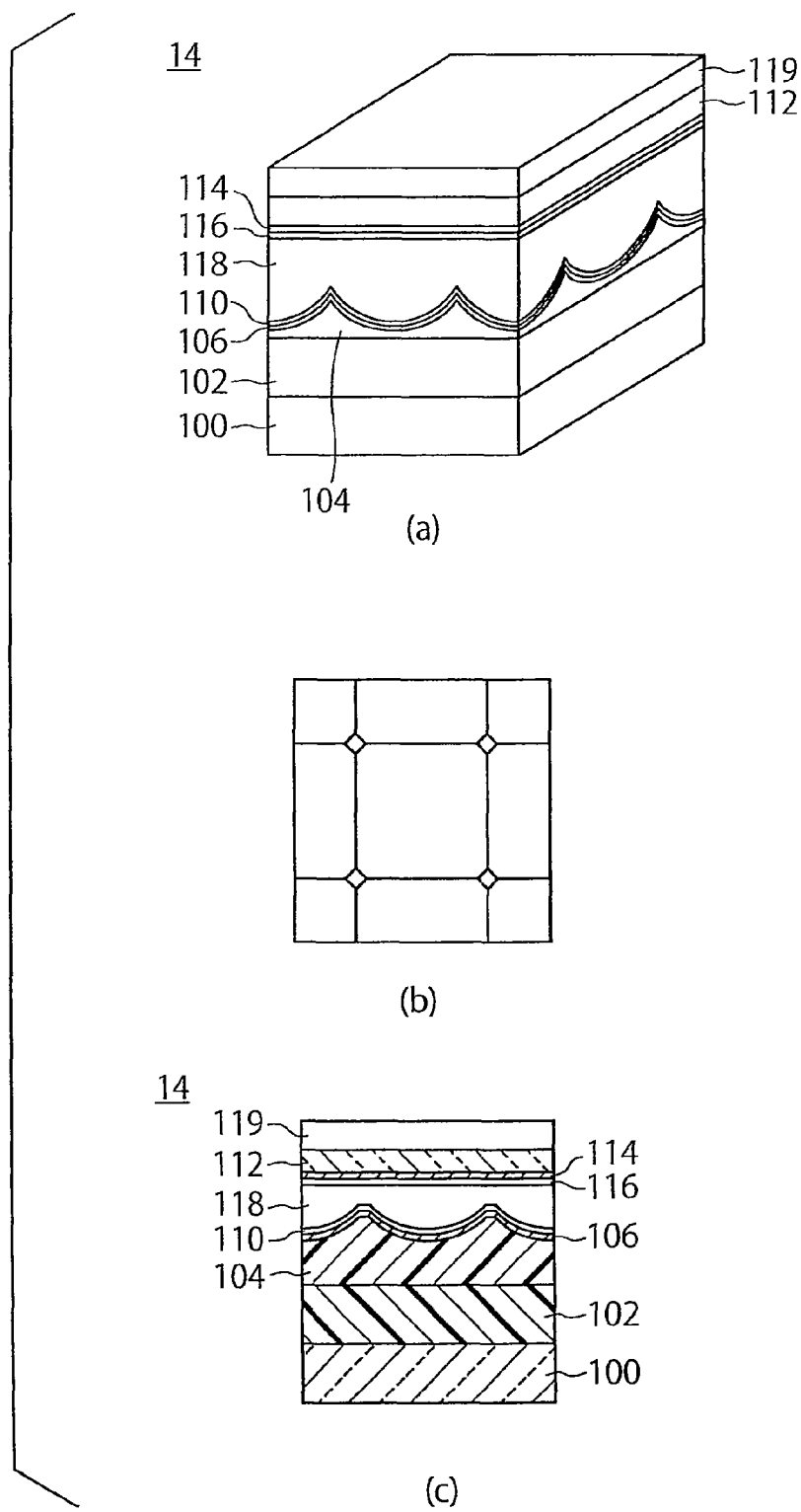
FIGS. 19(a) to 19(c) are diagrams for explaining the steps of manufacturing a liquid crystal optical element according to Example 2.

Next, a liquid crystal optical element 14 according to Example 2 will be described with reference to FIGS. 19(a) to 19(c). FIGS. 19(a) to 19(c) are a perspective view, a top view, and a cross-sectional view of the liquid crystal optical element 14 according to Example 2.

The liquid crystal optical element 14 of Example 2 is obtained by not having the embedded film 108, and forming the alignment film 110 on the transparent electrode film 106, and locating the liquid crystal layer 118 between the alignment film 110 and the alignment film 116 in the liquid crystal optical element 14 shown in FIGS. 18(a) to 18(c).

If the liquid crystal optical element 14 of Example 2 has the liquid crystal layer 118 having a refractive index close to that of the base film 104 that has a concave lens shape in a low-refractive-index state, the liquid crystal layer 118 functions as a transparent member with in the low-refractive-index state, and as a lens in a high-refractive-index state.

Example 3

Figure 20:
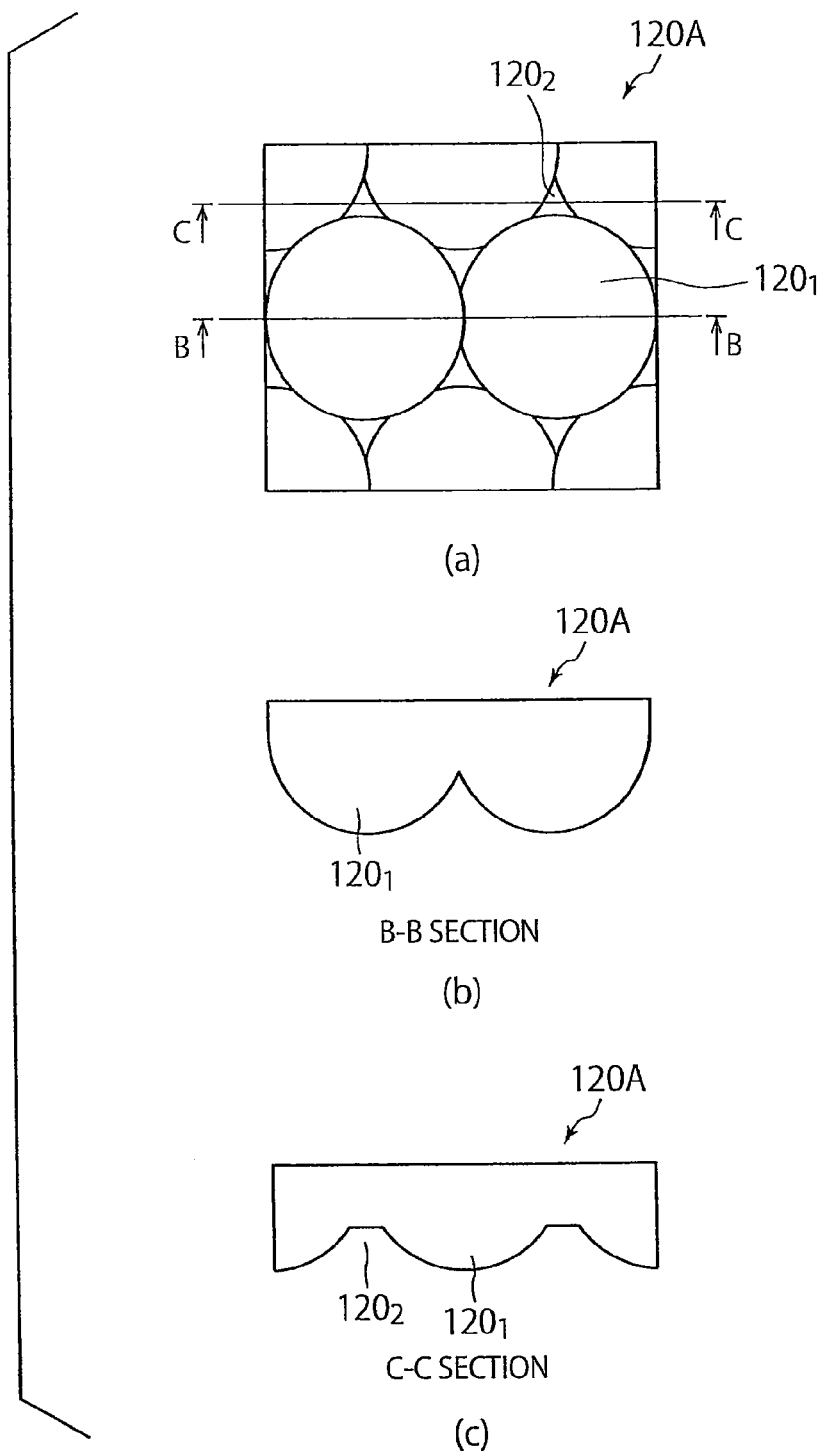
FIGS. 20(a) to 20(c) are diagrams for explaining an example of the shape of a master used in manufacturing the liquid crystal optical element according to Example 3.
Figure 21:
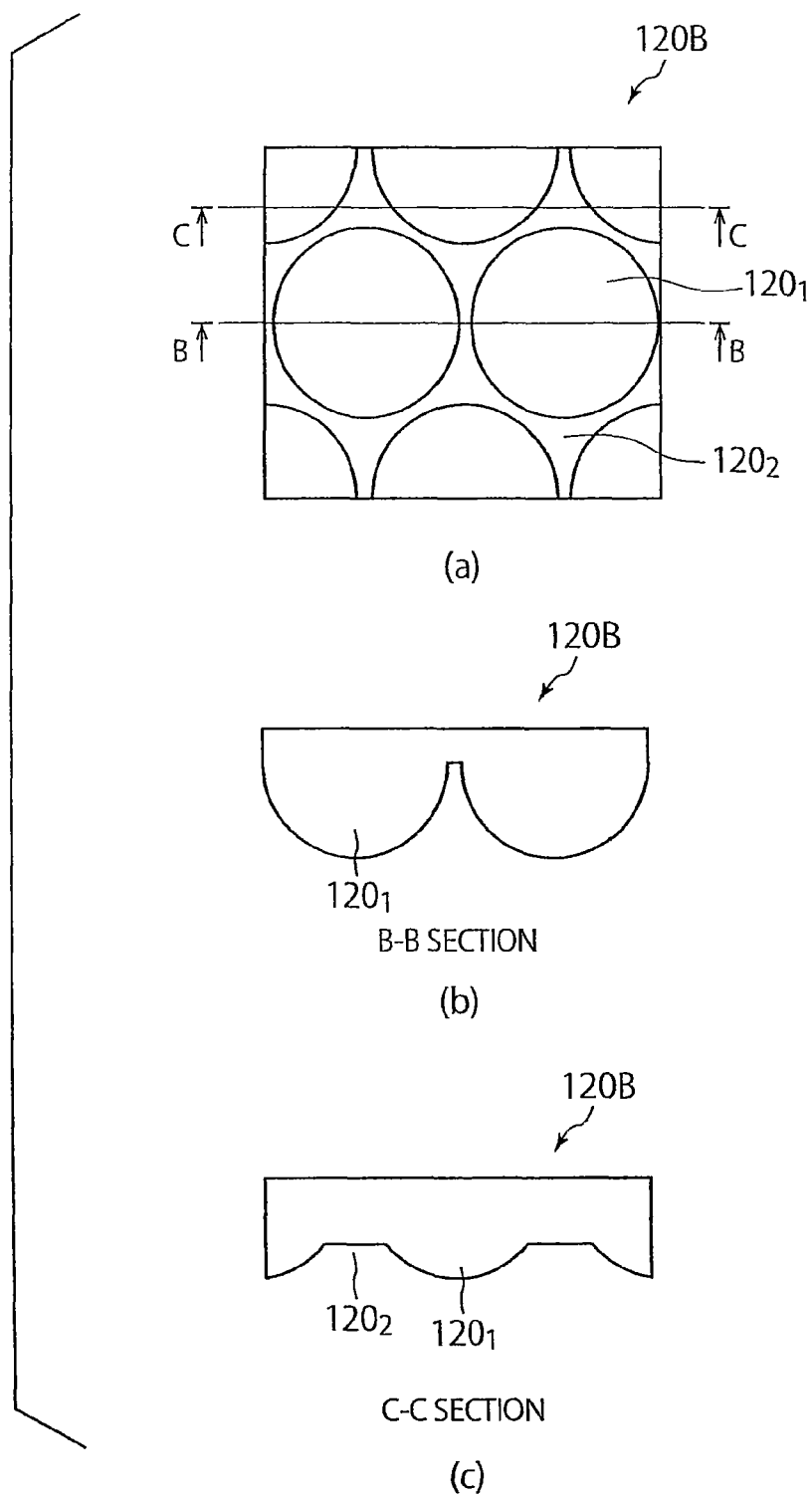
FIGS. 21(a) to 21(c) are diagrams for explaining another example of the master used in manufacturing the liquid crystal optical element according to Example 3.
Figure 22:
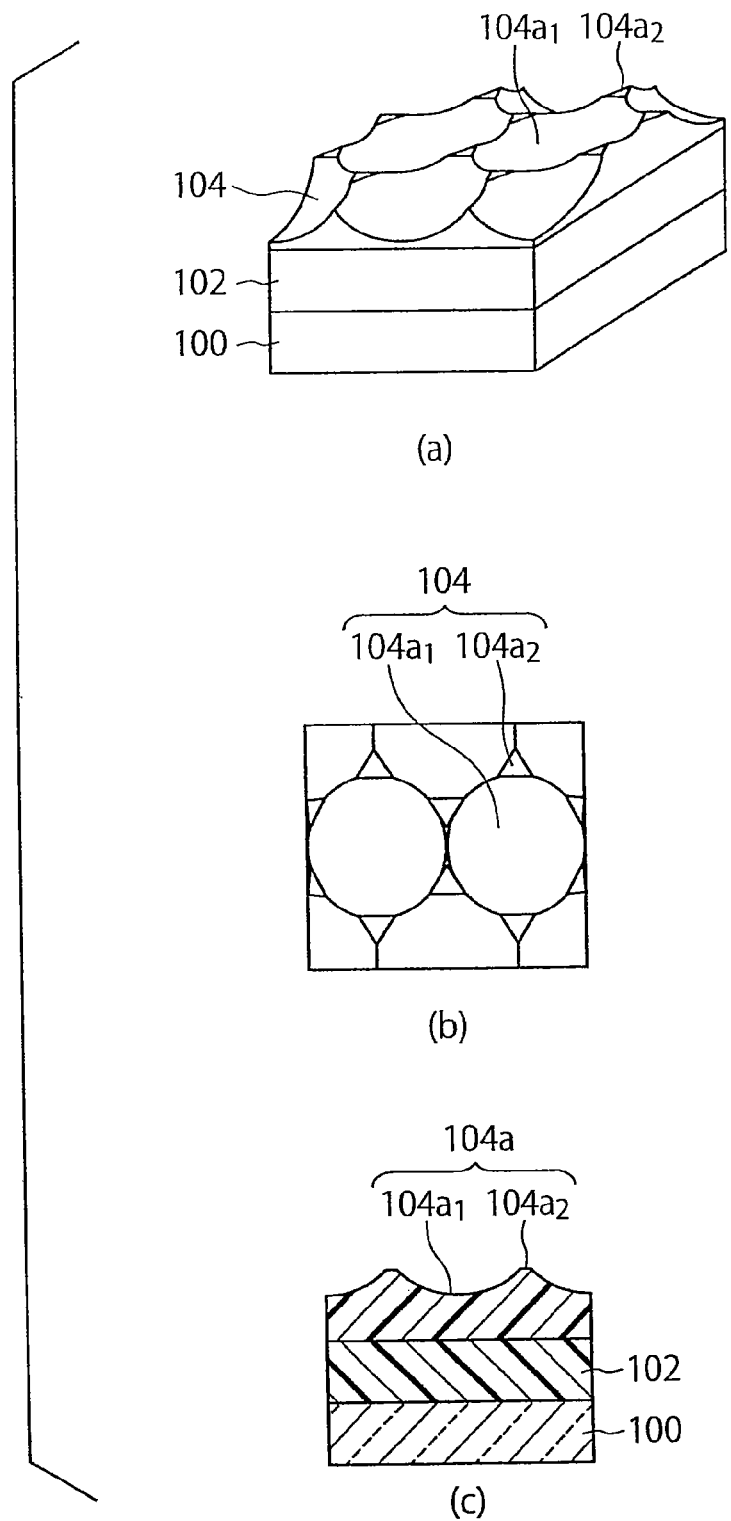
FIGS. 22(a) to 22(c) are diagrams for explaining the steps of manufacturing the liquid crystal optical element according to Example 3.

FIGS. 20(a) to 22(c) show the steps of manufacturing the liquid crystal optical element 14 according to Example 3. The liquid crystal optical element 14 of Example 3 is manufactured by the same steps as those for manufacturing the liquid crystal optical element 14 of Example 1 shown in FIGS. 12(a) to 12(c). A master (mold) 120A in a lens-array shape used to manufacture the liquid crystal optical element 14 of Example 3 has a shape as shown in FIGS. 20(a) to 20(c). FIG. 20(a) shows a bottom view of the master 120A, FIG. 20(b) is a cross-sectional view taken along line B-B of FIG. 20(a), and FIG. 20(c) is a cross-sectional view taken along line C-C of FIG. 20(a). The master 120A is formed of quartz, for example, and has a pattern including projecting portions $120_1$ that are hexagonally arranged, and recesses $120_2$. The projecting portions $120_1$ correspond to projecting portions of the respective lenses.

A master (mold) 120B having a lens-array shape shown in FIGS. 21(a) to 21(c) may also be used to manufacture the liquid crystal optical element 14 of Example 3. FIG. 21(a) shows a bottom view of the master 120B, FIG. 21(b) is a cross-sectional view taken along ling B-B of FIG. 21(a), and FIG. 21(c) is a cross-sectional view taken along line C-C of FIG. 21(a). The master 120B is formed of quartz, for example, and has a pattern including projecting portions $120_1$ and recesses $120_2$. The projecting portions $120_1$ correspond to projecting portions of the respective lenses.

The mask 120A is pressed against the base film 104 by an imprinting method to transfer the pattern on the master 120A to the base film 104. Then, if necessary, the base film 104 is cured. Subsequently, the master 120A is removed from the base film 104. FIG. 22(a), 22(b), 22(c) are a perspective view, top view, and a cross-sectional view of the state in which the master 120A is removed.

The pattern having a lens shape is thus transferred onto the base film 104, which then has recesses $104a_1$ that are regularly arranged, and projecting portions $104a_2$ at corner portions of the recesses $104a_1$. Specifically, a pattern including hexagonally-arranged recesses $104a_1$ each having a hemispheric shape is formed on the base film 104. The base film 104 with the pattern corresponds to the first substrate described above. In the pattern formed on the base film 104, the respective recesses $104a_1$ are separated from each other. Each projecting portion $104a_2$ of Example 3 has a wider area than each projecting portion $104a_2$ of Example 1.

Thereafter, the same steps as those of Example 1 shown in FIGS. 14(a) to 18(c) are performed to complete the liquid crystal optical element 14 of Example 3.

Thus, the liquid crystal optical element 14 of Example 3 differs from the liquid crystal optical element 14 of Example 1 in the pattern shape, i.e., the lens shape, formed on the base film 104.

Example 4

Figure 23:
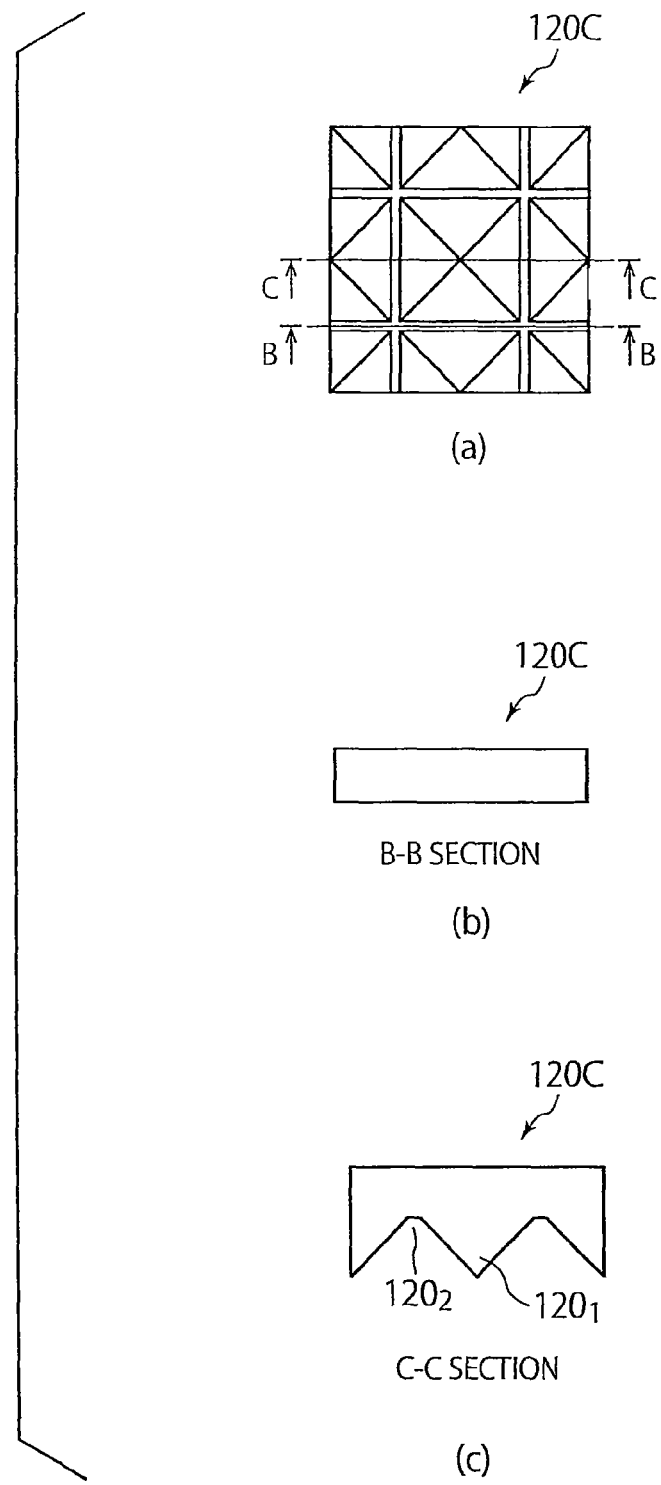
FIGS. 23(a) to 23(c) are diagrams for explaining an example of the shape of a master used in manufacturing the liquid crystal optical element according to Example 4.
Figure 24:
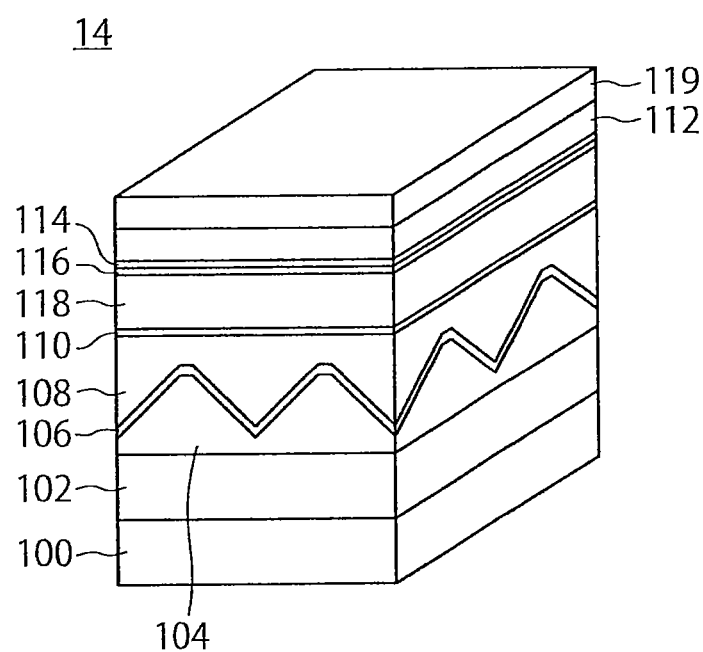
FIG. 24 is a perspective view showing a liquid crystal optical element according to Example 4.

A liquid crystal optical element 14 according to Example 4 will be described with reference to FIGS. 23(a) to 24. The liquid crystal optical element 14 of Example 4 is formed by using a master (mold) 120C having a lens-array shape as shown in FIGS. 23(a) to 23(c). FIG. 23(a) shows a bottom view of the master 120 C, FIG. 23(b) is a cross-sectional view taken along line B-B of FIG. 23(a), and FIG. 23(c) is a cross-sectional view taken along line C-C of FIG. 23(a). The master 120 C is formed of quartz, for example, and has projecting portions $120_1$ that are squarely arranged, and recesses $120_2$. The projecting portions $120_1$ of Example 4 have an inverted pyramid shape. Therefore, the cross-section of each projecting portion $120_1$ on a plane parallel to the main surface of the first electrode 14a is a square. The sectioned area of the projecting portion $120_1$ decreases toward the embedded film 108. FIG. 24 is a perspective view of the liquid crystal optical element 14 of Example 4, which is manufactured by the same steps as those of Example 1 except for the use of the master 120 C. The projecting portions of the master may have an inverted cone shape instead of the inverted pyramid shape. In this case, the projecting portions $120_1$ are arranged in either squarely or hexagonally. The projecting portions of the master may have other pyramid shapes such as an inverted six-sided pyramid shape. In such a case, the projecting portions $120_1$ are arranged hexagonally.

The liquid crystal optical elements 14 of Examples 1 to 4 are each formed directly on the wafer 100, on which the imaging element 16 is formed. Therefore, in Examples 1 to 4, the liquid crystal optical element 14 shown in FIG. 2 and the liquid crystal optical element holder 40 have the same structure, and a portion (not shown) of the liquid crystal optical element holder 40 corresponding to the transparent electrode 14b does not have a recess, and is planar.

However, the liquid crystal optical element 14 may be formed on a substrate that is different from the wafer 100 on which the imaging element 16 is formed through the same steps as have been described above, and then bonded to the wafer 100 on which the imaging element 16 is formed. In this case, the liquid crystal optical element 14 is held by the liquid crystal optical element holder 40 as shown in FIG. 2.

As described above, a liquid crystal optical element and a solid state imaging device having a function of switching between an imaging mode for obtaining a distance to a subject in a depth direction and a high-resolution two-dimensional imaging mode can be provided. Incidentally, the imaging element 16 of the solid state imaging device according to the first embodiment can be used in a still camera.

Second Embodiment

Figure 25:
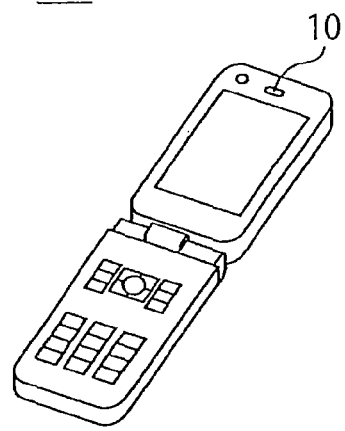
FIG. 25 is a perspective view showing a portable information terminal according to the second embodiment.

FIG. 25 shows a portable information terminal according to the second embodiment. The portable information terminal 200 of the second embodiment includes the solid state imaging device 1 according to the first embodiment. FIG. 25 shows an imaging module unit 10 of the solid state imaging device 1. It should be noted that FIG. 25 shows only an example of the portable information terminal.

According to the second embodiment, a portable information terminal can be provided having a function of switching between an imaging mode for obtaining a distance to a subject in a depth direction and an imaging mode for obtaining a high-resolution two-dimensional image.

The liquid crystal optical element used in the portable information terminal according to the second embodiment can be any of those according to the first embodiment and Examples 1 to 4.

Third Embodiment

Figure 26:
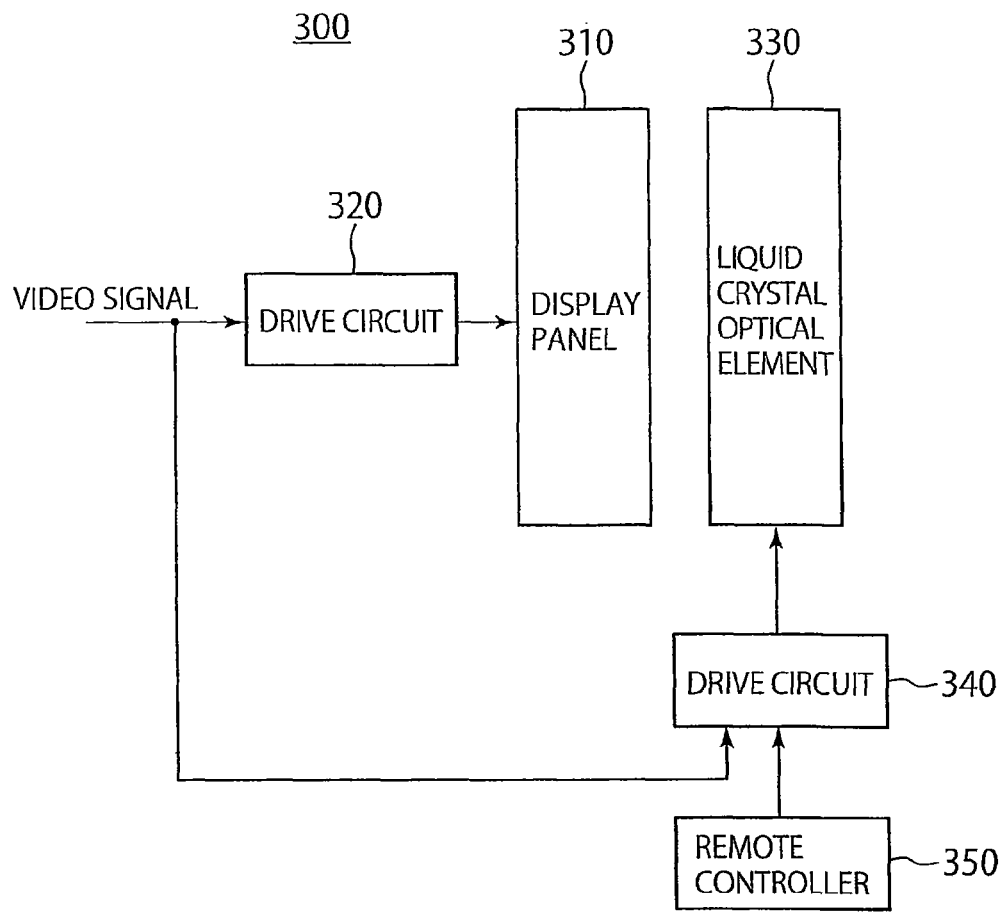
FIG. 26 is a block diagram showing a display device according to the third embodiment.

A display device according to the third embodiment will be described with reference to a block diagram shown in FIG. 26. The display device 300 of the third embodiment is capable of switching between a two-dimensional-image display mode and a three-dimensional-image display mode, and includes a display panel 310, a drive circuit 320, and a liquid crystal optical element 330.

The display panel 310 has a display screen in which pixels are arranged in a matrix form. A liquid crystal display panel of direct viewing type or projection type, a plasma display panel, a field emission display panel, or an organic EL display panel may also be used as long as pixels are arranged in a matrix form at respective positions within a display area on a plane.

The drive circuit 320 drives the display panel 310, sends video signals (data to be displayed) from the outside to the display panel 310 to assign the data to be displayed to the pixels of the display panel 310, thereby displaying a two-dimensional image or three-dimensional image on the display panel 310. The drive circuit 320 may be integrated with the display panel 310, or located outside the display panel 310.

The liquid crystal optical element 330 is located in front of the display panel 310 to control light rays from the pixels of the display panel 310 to have a variable focal point. The second electrode of the liquid crystal optical element 330 faces the display screen of the display panel. The liquid crystal optical element 330 is located between the display panel 310 and viewers. Thus, the first electrode of the liquid crystal optical element 330 is located between the viewers and the liquid crystal layer of the liquid crystal optical element 330.

The liquid crystal optical element 330 is, for example, the liquid crystal optical element 14 according to any of the first embodiment and Examples 1 to 4, and is capable of switching between the function of allowing light rays to move linearly and the function of lens. For example, if the display device is to display two-dimensional images, the function of allowing light rays to move linearly is used, and if the display device is to display three-dimensional images, the function of lens is used. The switching between the function of allowing light rays to move linearly and the function of lens may be automatically performed by the drive circuit 340 based on the video signals inputted to the drive circuit 320, or based on an instruction signal sent from a viewer to the drive circuit 340 by using a remote controller 350. In such cases, the display panel 310 or drive circuit 320 of the display device 300 preferably includes a function of estimating or detecting a depth information from two-dimensional video signals, if the video signals sent from the outside are two-dimensional video signals, by using well-known techniques, and generating three-dimensional video signals using the estimated or detected depth information. The estimation or detection of the depth information is performed by, for example, obtaining motion vectors of images.

As in the case of the first embodiment, a plurality of pixels (pixel block) is assigned to each lens of the liquid crystal optical element 330. The liquid crystal optical element 330 capable of switching between a function of allowing light rays to move linearly and a function of lens, used in a display device capable of displaying three-dimensional images, allows two-dimensional images to be displayed without reducing the resolution.

According to the third embodiment, a display device having a function of switching an imaging mode for obtaining a distance to a subject in a depth direction and an imaging mode for obtaining high-resolution two-dimensional images can be provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An imaging device comprising:
a liquid crystal optical element including a first electrode having a plurality of first recesses and projecting portions surrounding the first recesses on a first surface, each of the projecting portions having a flat face in contact with an outer circumference surrounding one of the first recesses, a second electrode facing the first surface of the first electrode, a first film located between the first recesses of the first electrode and the second electrode, and a liquid crystal layer located between the first film and the second electrode, the first recesses being hexagonally arranged on the first surface of the first electrode, the flat face of each of the projecting portions having a polygonal shape, each of sides of the polygonal shape being a part of an outer circumference surrounding one of the first recesses;
an imaging lens facing the second electrode to form an image of a subject on an imaging plane; and
an imaging element facing the first recess, the imaging element having a pixel block having a plurality of pixels.

2. The device according to claim 1, wherein the liquid crystal layer projects toward a side of the imaging element when a voltage is applied to the first electrode and the second electrode.

3. The device according to claim 1, further comprising a second film located between the first electrode and the liquid crystal layer, and a third film located between the second electrode and the liquid crystal layer.

4. The device according to claim 1, wherein each of the plurality of first recesses has a hemispheric shape.

5. The device according to claim 1, wherein each of the plurality of projecting portions has a cone or pyramid shape.

6. The device according to claim 1, wherein a surface of the second electrode facing the liquid crystal layer is planar or has second recesses respectively facing the plurality of first recesses of the first electrode.

7. A portable information terminal comprising the device according to claim 1.

8. A display device comprising:
a display panel having a display screen;
a drive circuit that drives the display panel; and
a liquid crystal optical element including a first electrode having a plurality of first recesses and projecting portions surrounding the first recesses on a first surface, each of the projecting portions having a flat face in contact with an outer circumference surrounding one of the first recesses, a second electrode facing the first surface of the first electrode, a first film located between the first recesses of the first electrode and the second electrode, and a liquid crystal layer located between the first film and the second electrode, the first recesses being hexagonally arranged on the first surface of the first electrode, the flat face of each of the projecting portions having a polygonal shape, each of sides of the polygonal shape being a part of an outer circumference surrounding one of the first recesses,
the display screen of the display panel facing the second electrode.

9. The device according to claim 8, wherein the liquid crystal layer projects toward a side of the display panel when a voltage is applied to the first electrode and the second electrode.

10. A liquid crystal optical element comprising:
a first electrode having a plurality of recesses and projecting portions surrounding the recesses on a first surface each of the projecting portions having a flat face in contact with an outer circumference surrounding one of the first recesses, the first recesses being hexagonally arranged on the first surface of the first electrode, the flat face of each of the projecting portions having a polygonal shape, each of sides of the polygonal shape being a part of an outer circumference surrounding one of the first recesses;
a second electrode facing the first surface of the first electrode;
a first film located between the recess of the first electrode and the second electrode; and
a liquid crystal layer located between the first film and the second electrode.

11. An imaging device comprising:
a liquid crystal optical element including a first electrode having a plurality of first recesses and projecting portions surrounding the first recesses on a first surface, each of the projecting portions having a flat face in contact with an outer circumference surrounding one of the first recesses, a second electrode facing the first surface of the first electrode, a first film located between the first recesses of the first electrode and the second electrode, and a liquid crystal layer located between the first film and the second electrode, the first recesses being squarely arranged on the first surface of the first electrode and being in hemispheric shape, the projecting portions being in a pyramid shape, the flat face of each of the projecting portions having a polygonal shape, each of sides of the polygonal shape being a part of an outer circumference surrounding one of the first recesses;
an imaging lens facing the second electrode to form an image of a subject on an imaging plane; and
an imaging element facing the first recesses, the imaging element having a pixel block having a plurality of pixels.

* * * * *